(12) United States Patent
Kim

(10) Patent No.: US 11,550,495 B2
(45) Date of Patent: Jan. 10, 2023

(54) OPERATING METHOD OF SEMICONDUCTOR MEMORY DEVICE, CONTROLLER, AND MEMORY SYSTEM HAVING THE SAME

(71) Applicant: SK hynix Inc., Gyeonggi-do (KR)

(72) Inventor: Ju Hee Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/342,067

(22) Filed: Jun. 8, 2021

(65) Prior Publication Data
US 2022/0171566 A1    Jun. 2, 2022

(30) Foreign Application Priority Data
Dec. 2, 2020   (KR) .......................... 10-2020-0167026

(51) Int. Cl.
*G06F 12/00*    (2006.01)
*G06F 3/06*    (2006.01)

(52) U.S. Cl.
CPC .......... *G06F 3/0655* (2013.01); *G06F 3/0619* (2013.01); *G06F 3/0679* (2013.01)

(58) Field of Classification Search
None
See application file for complete search history.

(56) References Cited

U.S. PATENT DOCUMENTS

| 10,379,955 B2 | 8/2019 | Kim et al. |
| 2014/0355340 A1* | 12/2014 | Sharon ................... G11C 29/04 |
| | | 365/185.03 |
| 2019/0088336 A1* | 3/2019 | Lin ...................... G06F 12/0246 |
| 2019/0362796 A1* | 11/2019 | Choi ................... G11C 16/0483 |
| 2020/0202952 A1 | 6/2020 | Lee et al. |

FOREIGN PATENT DOCUMENTS

KR   10-2019-0022987 A   3/2019

* cited by examiner

*Primary Examiner* — Daniel D Tsui
(74) *Attorney, Agent, or Firm* — IP & T Group LLP

(57) ABSTRACT

The disclosure relates to an operating method of controller, and memory system having the same, the method controls a semiconductor memory device including a plurality of memory blocks. The method includes: receiving read data output according to a first read operation performed on a selected memory block; selecting a read voltage set group from a read retry table based on a read error related indicator providing an indication that an error correction failure has occurred; and selecting a read voltage set from the selected read voltage set group based on whether the read error related indicator is greater than or equal to a predetermined reference value. The selected read voltage set has a minimum average distance with respect to a read voltage set used for the first read operation, and has a minimum first read voltage distance with respect to the read voltage set used for the first read operation.

20 Claims, 34 Drawing Sheets

| No. | R1 | R2 | R3 |
|---|---|---|---|
| 1 | R1_1 | R2_1 | R3_1 |
| 2 | R1_2 | R2_2 | R3_2 |
| 3 | R1_3 | R2_3 | R3_3 |
| 4 | R1_4 | R2_4 | R3_4 |
| ⋮ | ⋮ | ⋮ | ⋮ |
| n | R1_n | R2_n | R3_n |

FIG. 13

| No. | R1 | R2 | R3 | |
|---|---|---|---|---|
| 1 | R1_1 | R2_1 | R3_1 | ⎫ |
| 2 | R1_2 | R2_2 | R3_2 | |
| 3 | R1_3 | R2_3 | R3_3 | ⎬ RSG1 |
| 4 | R1_4 | R2_4 | R3_4 | |
| 5 | R1_5 | R2_5 | R3_5 | ⎭ |
| 6 | R1_6 | R2_6 | R3_6 | ⎫ |
| 7 | R1_7 | R2_7 | R3_7 | |
| 8 | R1_8 | R2_8 | R3_8 | ⎬ RSG2 |
| 9 | R1_9 | R2_9 | R3_9 | |
| 10 | R1_10 | R2_10 | R3_10 | ⎭ |
| ⋮ | ⋮ | ⋮ | ⋮ | ⋮ |
| n−4 | R1_(n−4) | R2_(n−4) | R3_(n−4) | ⎫ |
| n−3 | R1_(n−3) | R2_(n−3) | R3_(n−3) | |
| n−2 | R1_(n−2) | R2_(n−2) | R3_(n−2) | ⎬ RSGk |
| n−1 | R1_(n−1) | R2_(n−1) | R3_(n−1) | |
| n | R1_n | R2_n | R3_n | ⎭ |

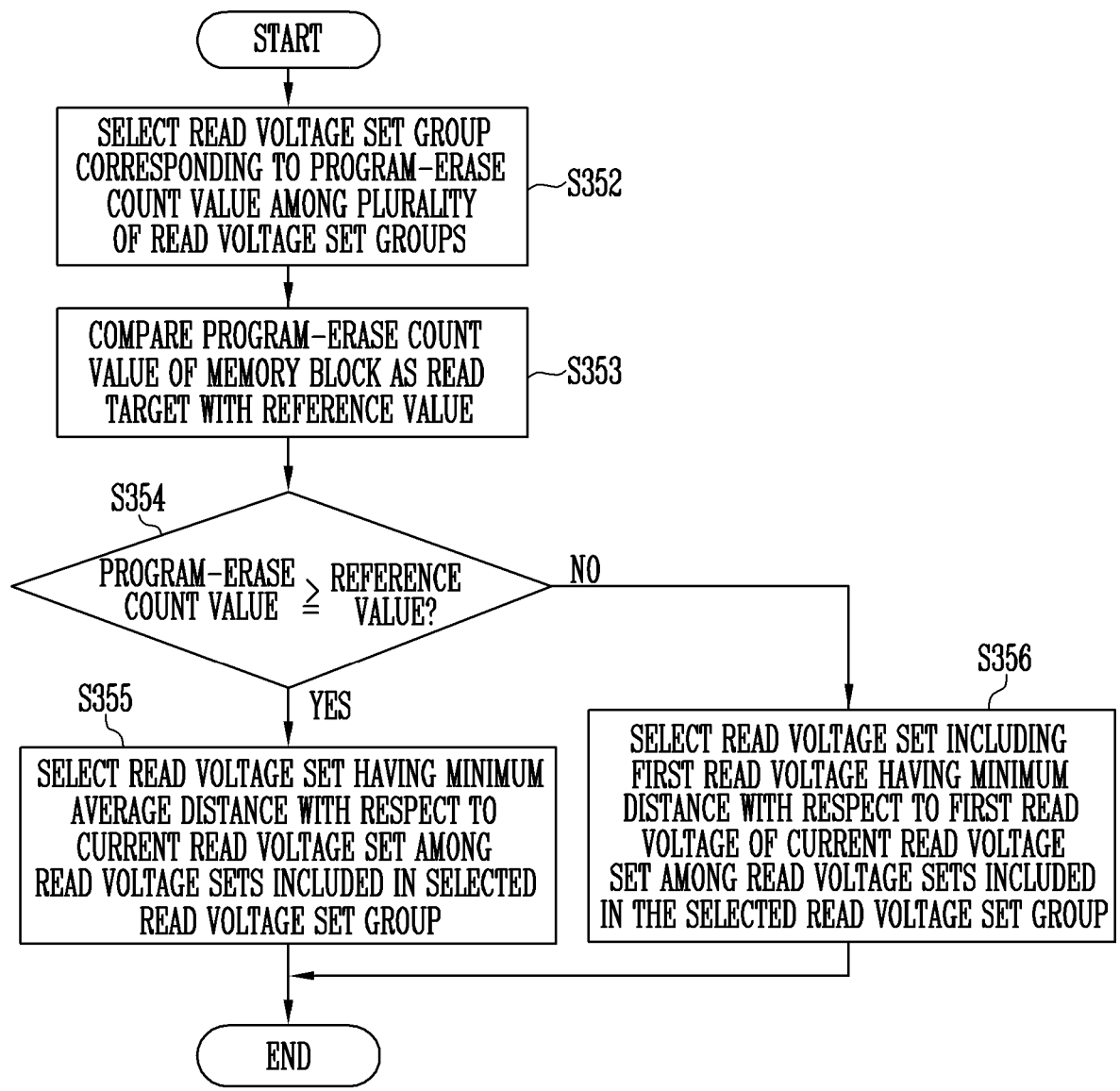

FIG. 19A

| No. | R1 | R2 | R3 | AVG distance | |
|---|---|---|---|---|---|
| 1 | R1_1 | R2_1 | R3_1 | – | |
| 2 | R1_2 | R2_2 | R3_2 | – | |
| 3 | R1_3 | R2_3 | R3_3 | – | |
| 4 | R1_4 | R2_4 | R3_4 | – | |
| 5 | R1_5 | R2_5 | R3_5 | – | |
| 6 | R1_6 | R2_6 | R3_6 | ad_6 | ⎫ |
| 7 | R1_7 | R2_7 | R3_7 | ad_7 | ⎬ Selected |
| 8 | R1_8 | R2_8 | R3_8 | ad_8 | |
| 9 | R1_9 | R2_9 | R3_9 | ad_9 | |
| 10 | R1_10 | R2_10 | R3_10 | ad_10 | ⎭ |
| ⋮ | ⋮ | ⋮ | ⋮ | ⋮ | |
| n−4 | R1_(n−4) | R2_(n−4) | R3_(n−4) | – | |
| n−3 | R1_(n−3) | R2_(n−3) | R3_(n−3) | – | |
| n−2 | R1_(n−2) | R2_(n−2) | R3_(n−2) | – | |
| n−1 | R1_(n−1) | R2_(n−1) | R3_(n−1) | – | |
| n | R1_n | R2_n | R3_n | – | |

FIG. 19B

| No. | R1 | R2 | R3 | R1 distance | |
|---|---|---|---|---|---|
| 1 | R1_1 | R2_1 | R3_1 | – | |
| 2 | R1_2 | R2_2 | R3_2 | – | |
| 3 | R1_3 | R2_3 | R3_3 | – | |
| 4 | R1_4 | R2_4 | R3_4 | – | |
| 5 | R1_5 | R2_5 | R3_5 | – | |
| 6 | R1_6 | R2_6 | R3_6 | d_6 | |
| 7 | R1_7 | R2_7 | R3_7 | d_7 | |
| 8 | R1_8 | R2_8 | R3_8 | d_8 | Selected |
| 9 | R1_9 | R2_9 | R3_9 | d_9 | |
| 10 | R1_10 | R2_10 | R3_10 | d_10 | |
| ⋮ | ⋮ | ⋮ | ⋮ | ⋮ | |
| n-4 | R1_(n-4) | R2_(n-4) | R3_(n-4) | – | |
| n-3 | R1_(n-3) | R2_(n-3) | R3_(n-3) | – | |
| n-2 | R1_(n-2) | R2_(n-2) | R3_(n-2) | – | |
| n-1 | R1_(n-1) | R2_(n-1) | R3_(n-1) | – | |
| n | R1_n | R2_n | R3_n | – | |

FIG. 22

| No. | R1 | R2 | R3 | Δ_avg | |
|---|---|---|---|---|---|
| 1 | R1_1 | R2_1 | R3_1 | Δ_1 | ⎫ |
| 2 | R1_2 | R2_2 | R3_2 | Δ_2 | |
| 3 | R1_3 | R2_3 | R3_3 | Δ_3 | ⎬ RSG1 |
| 4 | R1_4 | R2_4 | R3_4 | Δ_4 | |
| 5 | R1_5 | R2_5 | R3_5 | Δ_5 | ⎭ |
| 6 | R1_6 | R2_6 | R3_6 | Δ_6 | ⎫ |
| 7 | R1_7 | R2_7 | R3_7 | Δ_7 | |
| 8 | R1_8 | R2_8 | R3_8 | Δ_8 | ⎬ RSG2 |
| 9 | R1_9 | R2_9 | R3_9 | Δ_9 | |
| 10 | R1_10 | R2_10 | R3_10 | Δ_10 | ⎭ |
| ⋮ | ⋮ | ⋮ | ⋮ | ⋮ | ⋮ |
| n−4 | R1_(n−4) | R2_(n−4) | R3_(n−4) | Δ_(n−4) | ⎫ |
| n−3 | R1_(n−3) | R2_(n−3) | R3_(n−3) | Δ_(n−3) | |
| n−2 | R1_(n−2) | R2_(n−2) | R3_(n−2) | Δ_(n−2) | ⎬ RSGk |
| n−1 | R1_(n−1) | R2_(n−1) | R3_(n−1) | Δ_(n−1) | |
| n | R1_n | R2_n | R3_n | Δ_n | ⎭ |

FIG. 32

| No. | R1 | R2 | R3 | Δ_avg |
|---|---|---|---|---|
| 1 | R1_1 | R2_1 | R3_1 | Δ_1 |
| 2 | R1_2 | R2_2 | R3_2 | Δ_2 |
| ⋮ | ⋮ | ⋮ | ⋮ | ⋮ |
| 5 | R1_5 | R2_5 | R3_5 | Δ_5 |
| 6 | R1_6 | R2_6 | R3_6 | Δ_6 |
| ⋮ | ⋮ | ⋮ | ⋮ | ⋮ |
| 10 | R1_10 | R2_10 | R3_10 | Δ_10 |
| 11 | R1_11 | R2_11 | R3_11 | Δ_11 |
| ⋮ | ⋮ | ⋮ | ⋮ | ⋮ |
| 15 | R1_15 | R2_15 | R3_15 | Δ_15 |
| 16 | R1_16 | R2_16 | R3_16 | Δ_16 |
| ⋮ | ⋮ | ⋮ | ⋮ | ⋮ |
| 20 | R1_20 | R2_20 | R3_20 | Δ_20 |
| ⋮ | ⋮ | ⋮ | ⋮ | ⋮ |
| n−19 | R1_(n−19) | R2_(n−19) | R3_(n−19) | Δ_(n−19) |
| ⋮ | ⋮ | ⋮ | ⋮ | ⋮ |
| n−15 | R1_(n−15) | R2_(n−15) | R3_(n−15) | Δ_(n−15) |
| n−14 | R1_(n−14) | R2_(n−14) | R3_(n−14) | Δ_(n−14) |
| ⋮ | ⋮ | ⋮ | ⋮ | ⋮ |
| n−10 | R1_(n−10) | R2_(n−10) | R3_(n−10) | Δ_(n−10) |
| n−9 | R1_(n−9) | R2_(n−9) | R3_(n−9) | Δ_(n−9) |
| ⋮ | ⋮ | ⋮ | ⋮ | ⋮ |
| n−5 | R1_(n−5) | R2_(n−5) | R3_(n−5) | Δ_(n−5) |
| n−4 | R1_(n−4) | R2_(n−4) | R3_(n−4) | Δ_(n−4) |
| ⋮ | ⋮ | ⋮ | ⋮ | ⋮ |
| n | R1_n | R2_n | R3_n | Δ_n |

Row groupings (left): RSGsub_11 (rows 1–5), RSGsub_12 (rows 6–10), RSGsub_13 (rows 11–15), RSGsub_21 (rows 16–20), RSGsub_(k−1)3 (rows n−19 to n−15), RSGsub_k1 (rows n−14 to n−10), RSGsub_k2 (rows n−9 to n−5), RSGsub_k3 (rows n−4 to n).

Row groupings (right): RSG1 (rows 1–15), RSG2 (rows 16–20…), RSG(k−1) (…n−15), RSGk (n−14…n).

OPERATING METHOD OF SEMICONDUCTOR MEMORY DEVICE, CONTROLLER, AND MEMORY SYSTEM HAVING THE SAME

CROSS-REFERENCE TO RELATED APPLICATION

The present application claims priority under 35 U.S.C. § 119(a) to Korean patent application number 10-2020-0167026, filed on Dec. 2, 2020, with the Korean Intellectual Property Office, and which is incorporated herein by reference in its entirety.

BACKGROUND

1. Technical Field

One or more embodiments described herein relate to a method of operating a semiconductor memory device, a controller, and a memory system having the same.

2. Related Art

A semiconductor memory device may have a two-dimensional structure or a three-dimensional structure. In a two-dimensional structure, strings are arranged horizontally on a semiconductor substrate. In a three-dimensional structure, strings are arranged vertically on a semiconductor substrate. Three-dimensional memory devices achieve a greater degree of integration per area due to a vertical stacking of memory cells.

SUMMARY

Embodiments described herein provide a method of operating a semiconductor memory device, a controller, and a memory system having the same, which can improve read performance.

In accordance with an aspect of the present disclosure, there is provided a method for operating a controller to control a semiconductor memory device including a plurality of memory blocks, the method including: receiving, from the semiconductor memory device, read data output according to a first read operation performed on a selected memory block among the plurality of memory blocks; selecting a read voltage set group among a plurality of read voltage set groups in a read retry table, the read voltage set group selected based on a read error related indicator providing an indication that an error correction failure has occurred; and selecting a read voltage set among a plurality of read voltage sets in the selected read voltage set group, the read voltage set selected based on whether the read error related indicator is greater than or equal to a predetermined reference value, wherein, selecting the read voltage set includes selecting at least one of a read voltage set having a minimum average distance with respect to a read voltage set used for the first read operation, and a read voltage set having a minimum first read voltage distance with respect to the read voltage set used for the first read operation.

In accordance with another aspect of the present disclosure, there is provided a controller for controlling a semiconductor memory device including a plurality of memory blocks, the controller including: a storage configured to store a read retry table including a plurality of read voltage sets; a read voltage controller configured to adjust a read voltage used for a read operation of the semiconductor memory device; and error correction logic configured to perform an error correction operation on read data received as a result of a first read operation performed corresponding to a read request, wherein the read voltage controller is configured to: select a read voltage set group among a plurality of read voltage set groups in a the read retry table, the read voltage set group selected based on a read error related indicator providing an indication that an error correction failure of read data has occurred; select at least one of a read voltage set having a minimum average distance with a read voltage set used for the first read operation and a read voltage set having a minimum first read voltage distance with respect to the read voltage set used for the first read operation, the read voltage set selected from among a plurality of read voltage sets in the selected read voltage set group and based on whether the read error related indicator is greater than or equal to the predetermined reference value; and control the semiconductor memory device to perform a second read operation corresponding to the read request based on the selected read voltage set.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 13 illustrates an embodiment of a read retry table.

FIG. 18 illustrates an embodiment of an operation performed in the method of FIG. 17.

FIGS. 19A and 19B illustrate embodiments of operations in FIG. 18.

FIG. 22 illustrates an embodiment of a read retry table.

FIG. 32 illustrates an embodiment of a read retry table.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Figure 1:
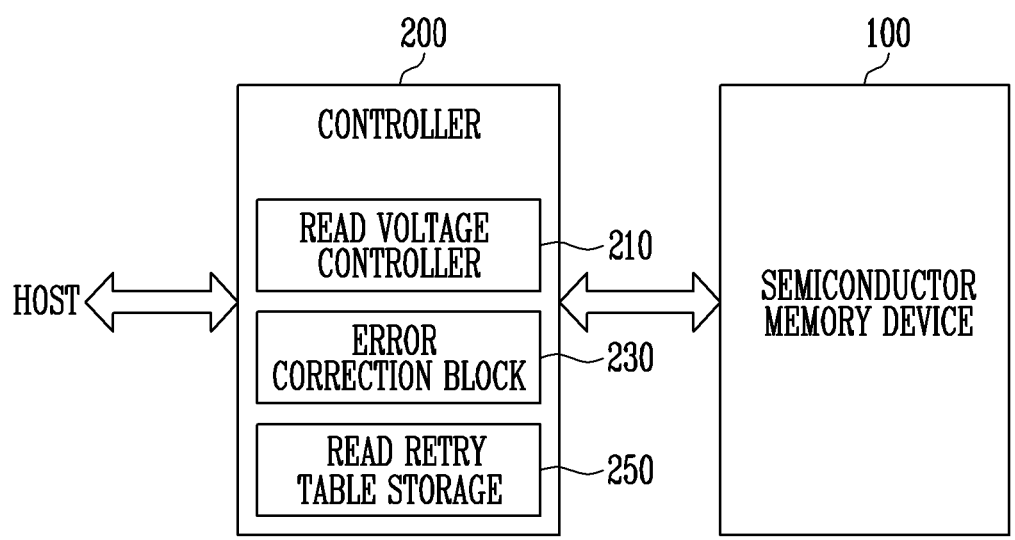
FIG. 1 illustrates an embodiment of a memory system.

FIG. 1 is a block diagram illustrating an embodiment of a memory system 1000 which includes a semiconductor memory device 100 and a controller 200. The memory system 1000 may communicate with a host, and the semiconductor memory device 100 and the controller 200 may be provided as one chip, one package or one device, or may be embodied in different chips, packages or devices. In one embodiment, the memory system 1000 may be provided as one storage device.

The controller 200 controls overall operation of the semiconductor memory device 100, for example, based on commands from the host. The semiconductor memory device 100 operates under control of the controller 200 and includes a memory cell array having a plurality of memory blocks. In an embodiment, the semiconductor memory device 100 may be a flash memory device.

The controller 200 may receive a write request, a read request, or the like, of data from the host and may control the semiconductor memory device 100 based on the request. For example, the controller 200 may generate commands for controlling operations of the semiconductor memory device 100 and may transmit the commands to the semiconductor memory device 100.

The semiconductor memory device 100 receives commands and addresses from the controller 200 and accesses areas selected by the addresses in the memory cell array. Thus, the semiconductor memory device 100 performs internal operations corresponding to commands on the areas selected by the addresses. Examples of the operations include a program operation, a read operation, and an erase operation. In the program operation, the semiconductor memory device 100 may program data in the area selected by the address. In the read operation, the semiconductor memory device 100 may read data from the area selected by the address. In an erase operation, the semiconductor memory device 100 may erase data stored in the area selected by the address.

The controller 200 includes a read voltage controller 210, an error correction block (e.g., error correction logic) 230, and a read retry table (RRT) storage 250. The read voltage controller 210 may manage and adjust read voltages for reading data stored in the semiconductor memory device 100. For example, when data read from the semiconductor memory device 100 is not corrected by the error correction block 230, the read voltage controller 210 may adjust at least one read voltage used for a read operation of the semiconductor memory device 100. In accordance with one embodiment, the read voltage controller 210 may adjust the read voltage based on a read retry table stored in the read retry table storage 250.

The error correction block 230 detects and corrects an error of data received from the semiconductor memory device 100 by using an Error Correction Code (ECC). The read voltage controller 100 may adjust a read voltage according to an error detection result of the error correction block 230 and may control the semiconductor memory device 100 to perform read retry. For example, the error correction block 230 may generate an ECC with respect to data to be stored in the semiconductor memory device 100. The generated ECC may be stored together with the data in the semiconductor memory device 100.

Subsequently, the error correction block 230 may detect and correct an error of data read from the semiconductor memory device 100 based on the stored ECC. For example, the error correction block 230 has a predetermined error correction ability. Data including an error bit (or fail bit) exceeding the error correction ability is referred to as 'Uncorrectable ECC (UECC) data.' When the data read from the semiconductor memory device 100 is UECC data, the read voltage controller 210 may control the semiconductor memory device 100 to again perform the read operation by adjusting the read voltages.

The read retry table storage 250 may store a read retry table, which, for example, may include a plurality of read voltage sets used for the read operation of the semiconductor memory device 100. One read voltage set includes at least one read voltage. In an example, the read voltage set may include one read voltage so as to perform the read operation on a single-level cell (SLC) storing 1-bit data. In one example, the read voltage set may include three read voltages so as to perform the read operation on a multi-level cell (MLC) storing 2-bit data. In one example, the read voltage set may include 7 read voltages so as to perform the read operation on a triple-level cell (TLC) storing 3-bit data. In one example, the read voltage set may include 15 read voltages so as to perform the read operation on a quad-level cell (QLC) storing 4-bit data. The read voltage set may include, for example, $2^N-1$ (N is a natural number) read voltages so as to perform the read operation on a memory cell storing N-bit data.

The read voltage controller 210 may adjust a read voltage used in the semiconductor memory device 100 when data read from the semiconductor memory device 100 is not corrected by the error correction block 230. For example, the read voltage controller 210 may adjust the read voltage based on the read retry table stored in the read retry table storage 250. In one embodiment, the read voltage used in semiconductor memory device 100 may be used such that the read operation is performed by sequentially applying the read voltage sets in the read retry table.

Figure 2:
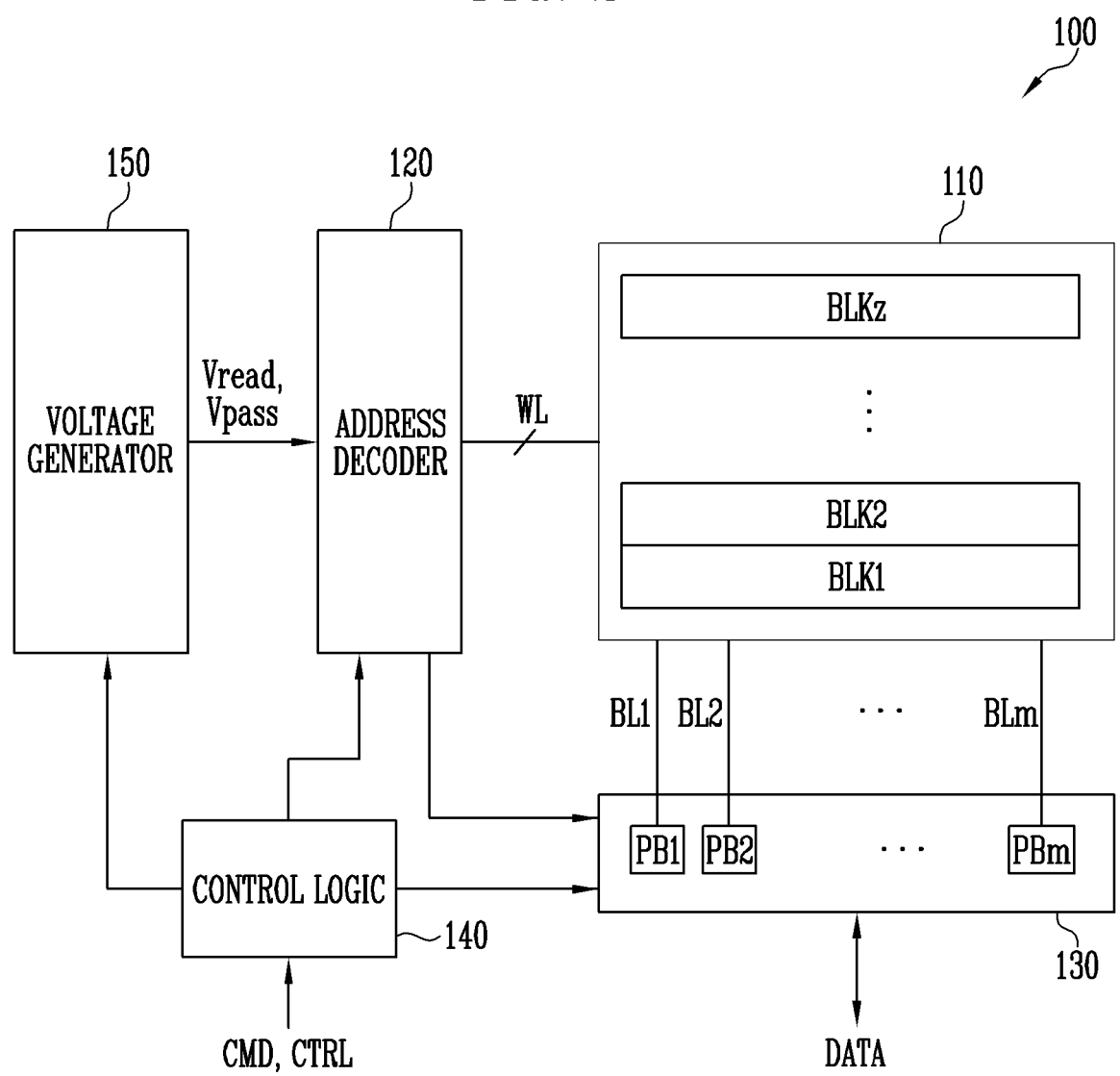
FIG. 2 illustrates an embodiment of a semiconductor memory device.

FIG. 2 is a block diagram illustrating an embodiment of a semiconductor memory device 100, which may include a memory cell array 110, an address decoder 120, a read/write circuit 130, a control logic 140, and a voltage generator 150.

The memory cell array 110 includes a plurality of memory blocks BLK1 to BLKz connected to the address decoder 120 through word lines WL. The memory blocks BLK1 to BLKz are connected to the read/write circuit 130 through bit lines BL1 to BLm, and each of the memory blocks BLK1 to BLKz includes a plurality of memory cells. In an embodiment, the memory cells may be nonvolatile memory cells having a vertical channel structure. In one embodiment, the memory cell array 110 may be configured as a memory cell array having a two-dimensional structure. In one embodiment, the memory cell array 110 may be configured as a memory cell array having a three-dimensional structure.

Each of the memory cells in the memory cell array 110 may store at least 1-bit data. In an embodiment, each of plurality of the memory cells included in the memory cell array 110 may be a single-level cell (SLC) storing 1-bit data. In one embodiment, each of the memory cells in the memory cell array 110 may be a multi-level cell (MLC) storing 2-bit data. In one embodiment, each of the memory cells in the memory cell array 110 may be a triple-level cell (TLC) storing 3-bit data. In one embodiment, each of the memory cells in the memory cell array 110 may be a quadruple-level cell (QLC) storing 4-bit data. In some embodiments, memory cell array 110 may include a plurality of memory cells, each storing 5 or more bit data.

The address decoder 120, the read/write circuit 130, the control logic 140 and the voltage generator 150 may operate as a peripheral circuit for driving the memory cell array 110. The address decoder 120 is connected to the memory cell array 110 through the word lines WL and operates under control of the control logic 140. The address decoder 120 receives an address through an input/output buffer in the semiconductor memory device 100. When power is supplied to the semiconductor memory device 100, information stored in a Content Addressable Memory (CAM) block may be read by the peripheral circuit. The peripheral circuit may then control the memory cell array 110 to perform a data input/output operation of memory cells under a condition set according to the read information.

The address decoder 120 decodes a block address in the received address and selects at least one memory block according to the decoded block address. In a read voltage application operation during a read operation, the address decoder 120 may apply a read voltage Vread generated by the voltage generator 150 to a selected word line of the selected memory block, and may apply a pass voltage Vpass generated by the voltage generator 150 to unselected word lines. Also, in a program verify operation, the address decoder 120 may apply a verify voltage generated by the voltage generator 150 to the selected word line of the selected memory block and may apply the pass voltage Vpass to unselected word lines.

The address decoder 120 decodes a column address in the received addresses and transmits the decoded column address to the read/write circuit 130.

In one embodiment, read and program operations of semiconductor memory device 100 may be performed in units of pages. An address received in response to a request for the read and program operations may include a block address, a row address, and a column address. The address decoder 120 selects one memory block and one word line according to the block address and the row address. The column address is decoded by the address decoder 120 to be provided to the read/write circuit 130. Memory cells connected to one word line may be referred to as a "physical page."

The address decoder 120 may include a block decoder, a row decoder, a column decoder, an address buffer, and the like.

The read/write circuit 130 includes a plurality of page buffers PB1 to PBm, and may operate as a read circuit in a read operation and as a write circuit in a write operation. The page buffers PB1 to PBm are connected to the memory cell array 110 through the bit lines BL1 to BLm. In order to sense a threshold voltage of memory cells in a read operation or a program verify operation, the page buffers PB1 to PBm latch sensing data by sensing, at a sensing node, a change in the amount of current flowing according to a program state of a corresponding memory cell. This operation may be performed while continuously supplying a sensing current to bit lines connected to the memory cells. Read/write circuit 130 may operate in response to page buffer control signals from control logic 140.

In a read operation, the read/write circuit 130 may temporarily store read data by sensing data of a memory cell and then may output data DATA to the input/output buffer of the semiconductor memory device 100. In an exemplary embodiment, the read/write circuit 130 may include a column select circuit and the like in addition to the page buffers (or page registers).

The control logic 140 is connected to the address decoder 120, the read/write circuit 130, and the voltage generator 150. The control logic 140 receives a command CMD and a control signal CTRL though the input/output buffer of the semiconductor memory device 100. The control logic 140 may control various operations of semiconductor memory device 100 in response to the control signal CTRL. Also, the control logic 140 may output a control signal for adjusting a sensing node precharge potential level of the plurality of page buffers PB1 to PBm. The control logic 140 may control the read/write circuit 130 to perform a read operation of the memory cell array 110.

The voltage generator 150 generates a read voltage Vread and a pass voltage Vpass in a read operation in response to a control signal output from the control logic 140. In order to generate a plurality of voltages having various voltage levels, the voltage generator 150 may include a plurality of pumping capacitors. The pumping capacitors may receive an internal power voltage and may output different voltages when the pumping capacitors are selectively activated by the control logic 140.

In one embodiment, the address decoder 120, the read/write circuit 130, and the voltage generator 150 may serve as a peripheral circuit for performing a read operation, a write operation, and an erase operation on the memory cell array 110. The peripheral circuit performs these operations under control of the control logic 140.

Figure 3:
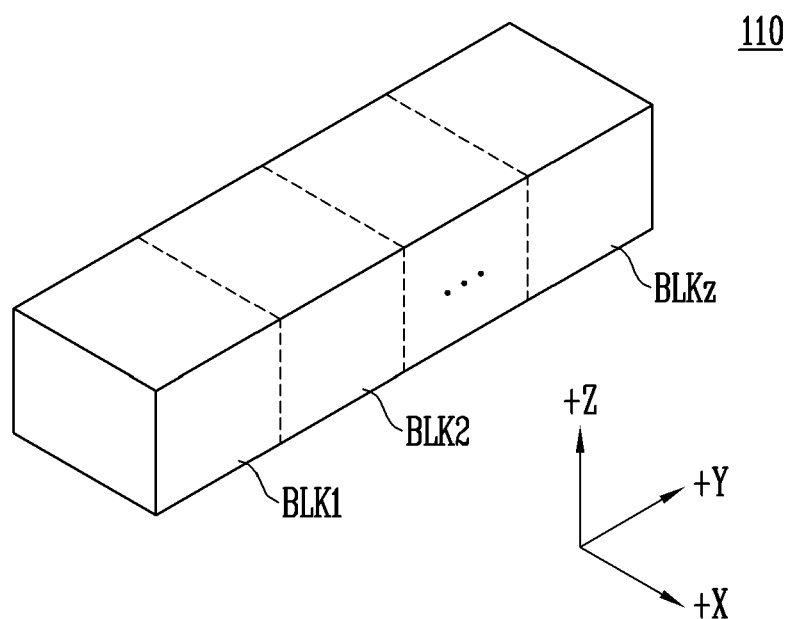
FIG. 3 illustrates an embodiment of a memory cell array.

FIG. 3 is a diagram illustrating an embodiment of the memory cell array 110, which may include a plurality of memory blocks BLK1 to BLKz. Each memory block may have a three-dimensional structure and may include a plurality of memory cells stacked on a substrate. The memory cells may be arranged along +X, +Y, and +Z directions. Embodiments of each memory block are described with reference to FIGS. 4 and 5.

Figure 4:
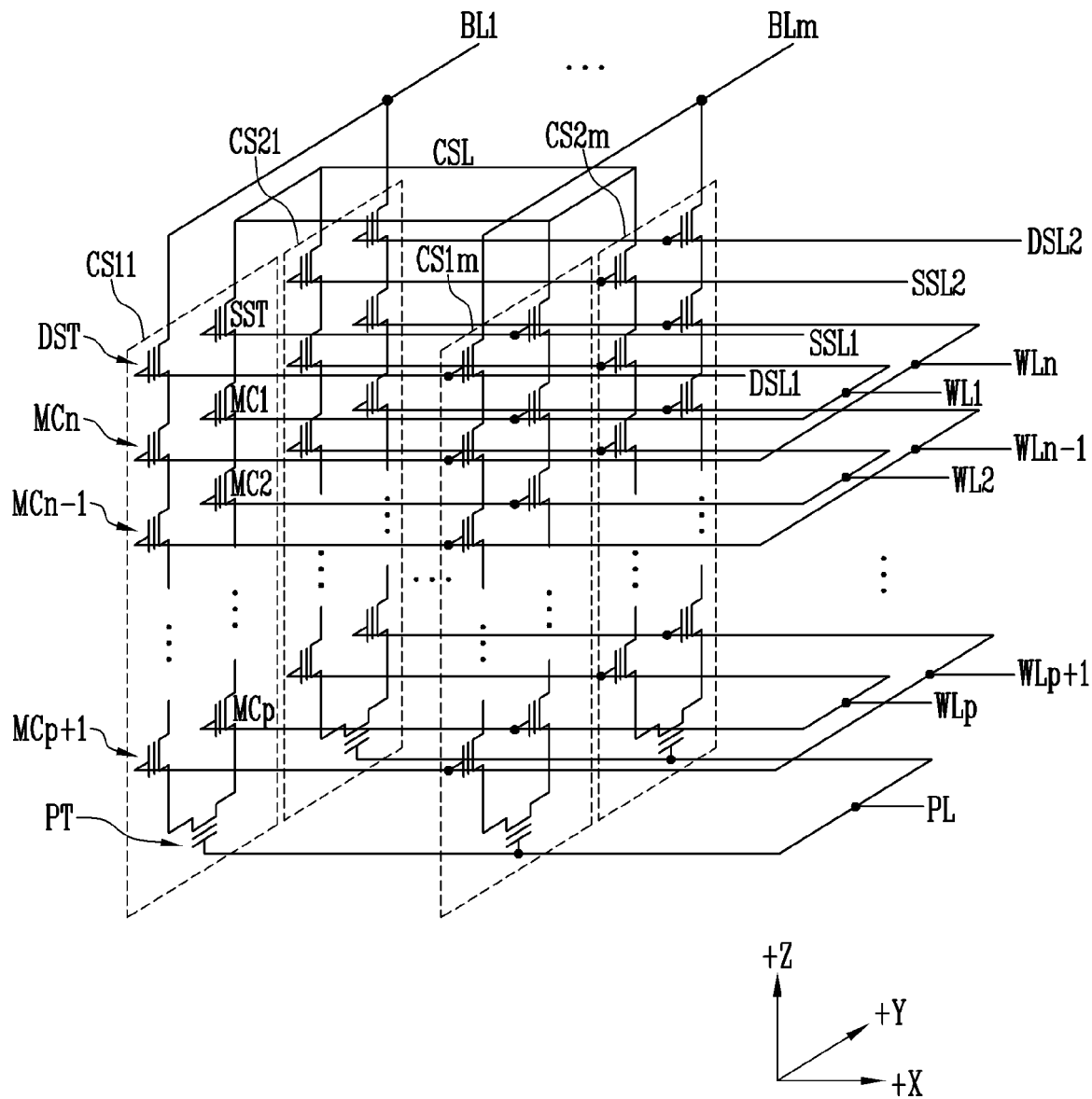
FIG. 4 illustrates an embodiment of a memory block.

FIG. 4 is a circuit diagram illustrating a memory block BLKa, which, for example, may be representative of the memory blocks BLK1 to BLKz shown in FIG. 3.

Referring to FIG. 4, the memory block BLKa may include a plurality of cell strings CS11 to CS1$m$ and CS21 to CS2$m$. In an embodiment, each of the cell strings CS11 to CS1$m$ and CS21 to CS2$m$ may be formed in a predetermined shape, e.g., a U shape or another shape. In the memory block BLKa, m cell strings are arranged in a row direction (e.g., +X direction). Although a case two cell strings arranged in a column direction (e.g., +Y direction) is illustrated in FIG. 4, this is for convenience of description and it will be understood that three cell strings may be arranged in the column direction.

Each of the cell strings CS11 to CS1$m$ and CS21 to CS2$m$ may include at least one source select transistor SST, first to nth memory cells MC1 to MCn, a pipe transistor PT, and at least one drain select transistor DST. The select transistors SST and DST and the memory cells MC1 to MCn may have similar structures.

In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is connected between a common source line CSL and memory cells MC1 to MCp. In an embodiment, the source select transistors of cell strings arranged on the same row are connected to a source select line extending in the row direction, and the source select transistors of cell strings arranged on different rows are connected to different source select lines. In FIG. 4, the source select transistors of the cell strings CS11 to CS1$m$ on a first row are connected to a first source select line SSL1. The source select transistors of the cell strings CS21 to CS2$m$ on a second row are connected to a second source select line SSL2.

In one embodiment, the source select transistors of the cell strings CS11 to CS1$m$ and CS21 to CS2$m$ may be commonly connected to one source select line.

The first to nth memory cells MC1 to MCn of each cell string are connected between the source select transistor SST and the drain select transistor DST. The first to nth memory cells MC1 to MCn may be divided into first to pth memory cells MC1 to MCp and a (p+1)th to nth memory cells MCp+1 to MCn. The first to pth memory cells MC1 to MCp are sequentially arranged in the opposite direction of a +Z direction, and are connected in series between the source select transistor SST and the pipe transistor PT. The (p+1)th to nth memory cells MCp+1 to MCn are sequentially arranged in the +Z direction and connected in series between the pipe transistor PT and the drain select transistor DST. The first to pth memory cells MC1 to MCp and the (p+1)th to nth memory cells MCp+1 to MCn are connected through the pipe transistor PT. Gate electrodes of the first to nth memory cells MC1 to MCn of each cell string are connected to first to nth word lines WL1 to WLn, respectively.

A gate of the pipe transistor PT of each cell string is connected to a pipe line PL.

The drain select transistor DST of each cell string is connected between a corresponding bit line and the memory cells MCp+1 to MCn. Cell strings arranged in the row direction are connected to a drain select line extending in the row direction. The drain select transistors of the cell strings CS11 to CS1$m$ on the first row are connected to a first drain select line DSL1. The drain select transistors of the cell strings CS21 to CS2$m$ on the second row are connected to a second drain select line DSL2.

Cell strings arranged in the column direction are connected to a bit line extending in the column direction. In FIG. 4, the cell strings CS11 and CS21 on a first column are connected to a first bit line BL1. The cell strings CS1$m$ and CS2$m$ on an mth column are connected to an mth bit line BLm.

Memory cells connected to the same word line in the cell strings arranged in the row direction constitute one page. For example, memory cells connected to the first word line WL1 in the cell strings CS11 to CS1$m$ on the first row constitute one page. Memory cells connected to the first word line WL1 in the cell strings CS21 to CS2$m$ on the second row constitute another page. When any one of the drain select lines DSL1 and DSL2 may be selected, cell strings arranged in one row direction may be selected. When any one of the word lines WL1 to WLn is selected, one page may be selected in the selected cell strings.

In one embodiment, even bit lines and odd bit lines may be provided instead of the first to mth bit lines BL1 to BLm. In addition, even-numbered cell strings among the cell strings CS11 to CS1$m$ or CS21 to CS2$m$ arranged in the row direction may be connected to the even bit lines, respectively, and odd-numbered cell strings among the cell strings CS11 to CS1$m$ or CS21 to CS2$m$ arranged in the row direction may be connected to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCp. In one embodiment, the at least one dummy memory cell may be provided to decrease an electric field between the drain select transistor DST and the memory cells MCp+1 to MCn. When the number of dummy memory cells increases, reliability of an operation of the memory block BLKa may be improved, but the size of the memory block BLKa increases. When the number of dummy memory cells decreases, the size of the memory block BLKa decreases, but reliability of an operation of the memory block BLKa may be deteriorated.

In order to efficiently control the at least one dummy memory cell, the dummy memory cells may have a threshold voltage. Before or after an erase operation of the memory block BLKa, a program operation may be performed on all or some of the dummy memory cells. When an erase operation is performed after the program operation is performed, the threshold voltage of the dummy memory cells control a voltage applied to the dummy word lines connected to the respective dummy memory cells, so that the dummy memory cells can have the threshold voltage.

Figure 5:
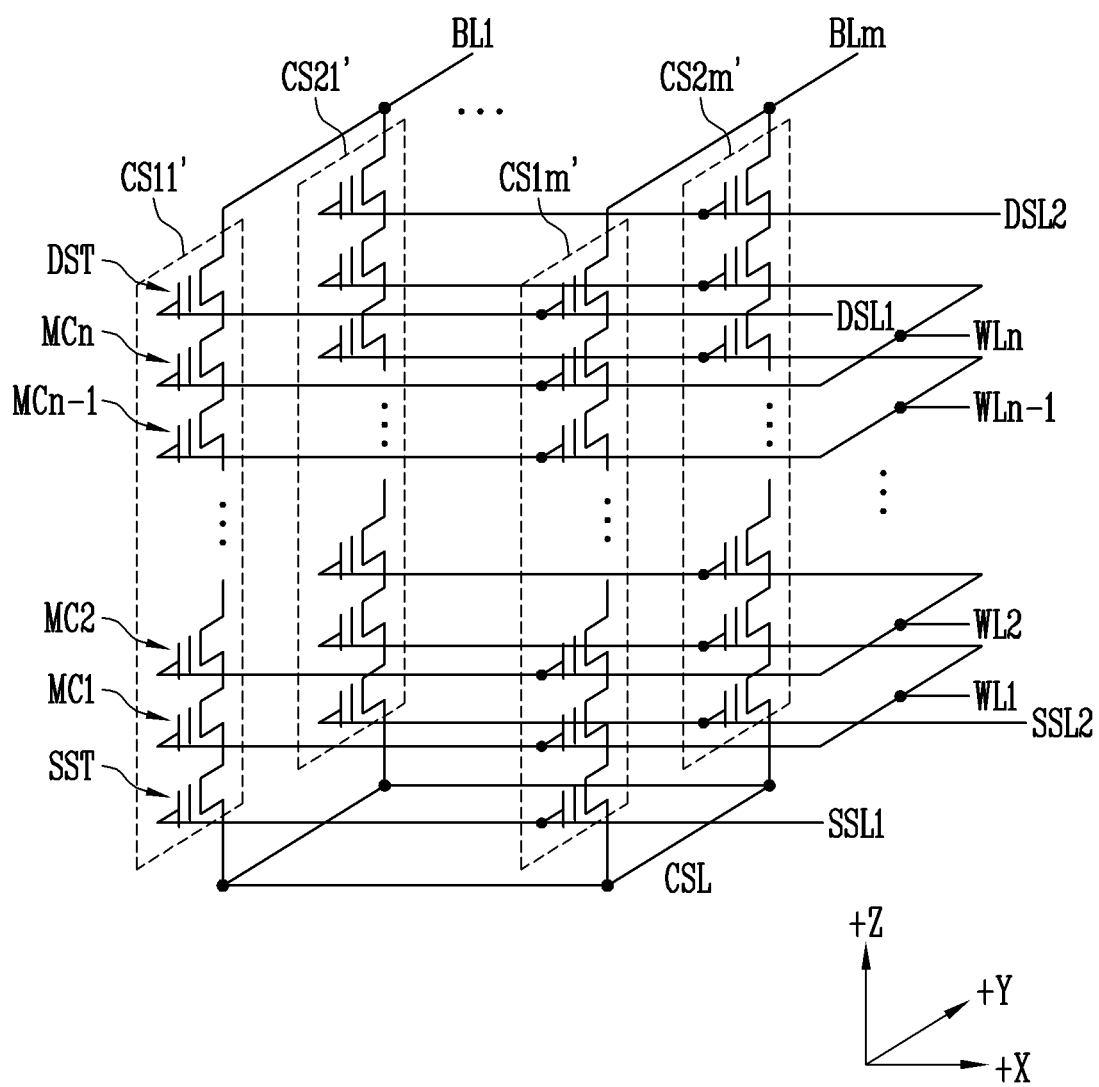
FIG. 5 illustrates an embodiment of a memory block.

FIG. 5 is a circuit diagram illustrating an embodiment of a memory block BLKb, which may be representative of the memory blocks BLK1 to BLKz shown in FIG. 3.

Referring to FIG. 5, the memory block BLKb may include a plurality of cell strings CS11' to CS1m' and CS21' to CS2m' that extend along the +Z direction. Each of the cell strings CS11' to CS1m' and CS21' to CS2m' may include at least one source select transistor SST, first to nth memory cells MC1 to MCn, and at least one drain select transistor DST stacked on a substrate under memory block BLKb.

The source select transistor SST of each cell string is connected between a common source line CSL and the memory cells MC1 to MCn. The source select transistors of cell strings arranged on the same row are connected to the same source select line. The source select transistors of the cell strings CS11' to CS1m' arranged on a first row are connected to a first source select line SSL1. Source select transistors of the cell strings CS21' to CS2m' arranged on a second row are connected to a second source select line SSL2. In one embodiment, the source select transistors of the cell strings CS11' to CS1m' and CS21' to CS2m' may be commonly connected to one source select line.

The first to nth memory cells MC1 to MCn of each cell string are connected in series between the source select transistor SST and the drain select transistor DST. Gate electrodes of the first to nth memory cells MC1 to MCn are connected to first to nth word lines WL1 to WLn, respectively.

The drain select transistor DST of each cell string is connected between a corresponding bit line and the memory cells MC1 to MCn. The drain select transistors of cell strings arranged in the row direction are connected to a drain select line extending in the row direction. The drain select transistors of the cell strings CS11' to CS1m' on the first row are connected to a first drain select line DSL1. The drain select transistors of the cell strings CS21' to CS2m' on the second row are connected to a second drain select line DSL2.

The memory block BLKb of FIG. 5 may therefore have a circuit configuration similar to that of the memory block BLKa of FIG. 4, except that the pipe transistor PT is excluded from each cell string in FIG. 5.

In one embodiment, even bit lines and odd bit lines may be provided instead of the first to mth bit lines BL1 to BLm. In addition, even-numbered cell strings among the cell strings CS11' to CS1m' or CS21' to CS2m' arranged in the row direction may be connected to the even bit lines, respectively. Odd-numbered cell strings among the cell strings CS11' to CS1m' or CS21' to CS2m' arranged in the row direction may be connected to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCn. In an embodiment, the at least one dummy memory cell may be provided to decrease an electric field between the drain select transistor DST and the memory cells MC1 to MCn. When the number of dummy memory cells increases, reliability of operation of memory block BLKb may be improved, but the size of the memory block BLKb is increased. When the number of dummy memory cells decreases, the size of the memory block BLKb decreases but reliability of an operation of the memory block BLKb may be deteriorated.

In order to efficiently control the at least one dummy memory cell, the dummy memory cells may have a threshold voltage. Before or after an erase operation of the memory block BLKb, a program operation may be performed on all or some of the dummy memory cells. When an erase operation is performed after the program operation is performed, the threshold voltage of the dummy memory cells control a voltage applied to the dummy word lines connected to the respective dummy memory cells, so that the dummy memory cells can have the threshold voltage.

Figure 6:
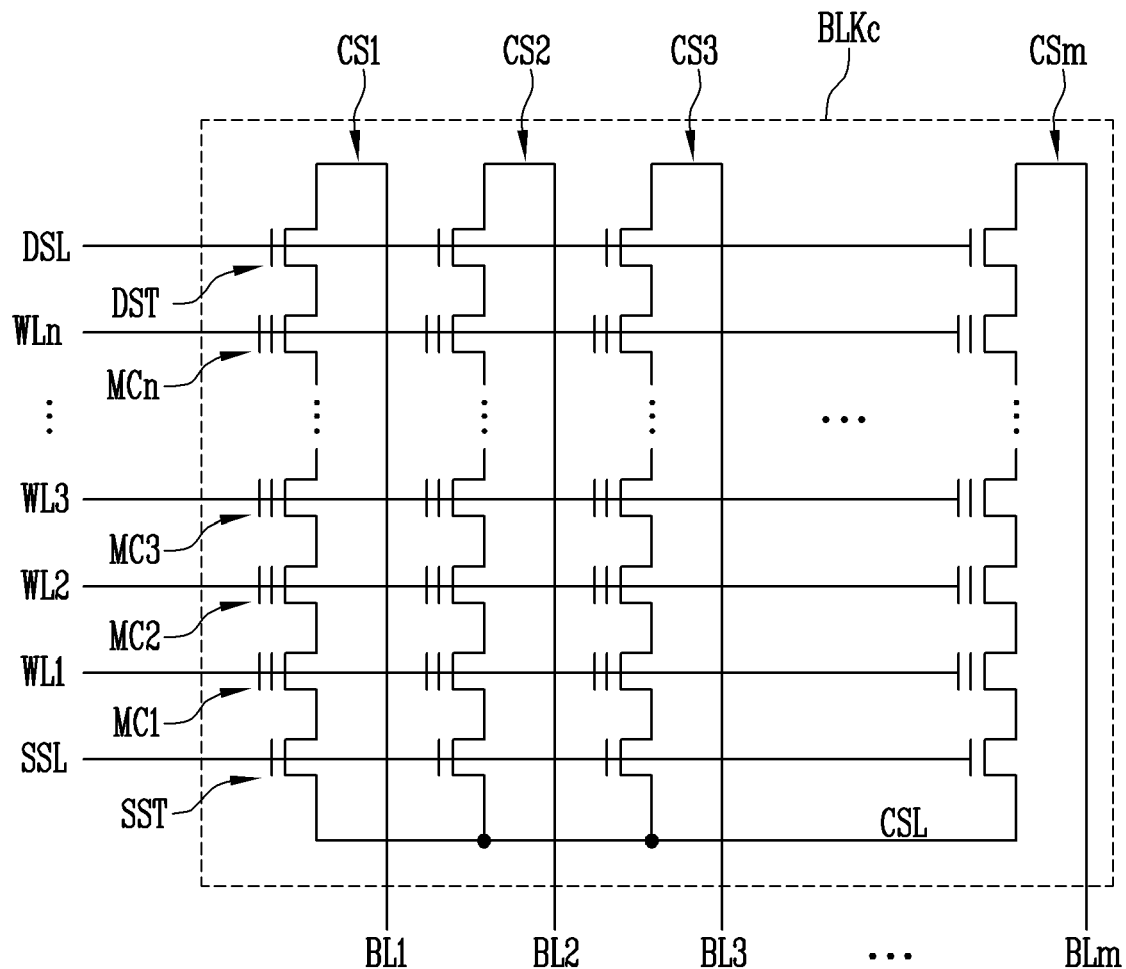
FIG. 6 illustrates an embodiment of a memory block.

FIG. 6 is a circuit diagram illustrating an embodiment of a memory block BLKc, which, for example, may be representative of the plurality of memory blocks BLK1 to BLKz in memory cell array 110 shown in FIG. 2.

Referring to FIG. 6, the memory block BLKc includes a plurality of strings CS1 to CSm connected to a plurality of bit lines BL1 to BLm, respectively. Each of the strings CS1 to CSm includes at least one source select transistor SST, first to nth memory cells MC1 to MCn, and at least one drain select transistor DST. Each of the select transistors SST and DST and the memory cells MC1 to MCn may have a similar structure.

In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is connected between a common source line CSL and the memory cells MC1 to MCn.

The first to nth memory cells MC1 to MCn of each cell string is connected between the source select transistor SST and the drain select transistor DST.

The drain select transistor DST of each cell string is connected between a corresponding bit line and the memory cells MC1 to MCn.

Memory cells connected to the same word line may constitute one page. When a drain select line DSL is selected, the cell strings CS1 to CSm may be selected. When any one of word lines WL1 to WLn is selected, one page among selected cell strings may be selected.

In one embodiment, even bit lines and odd bit lines may be provided instead of the first to mth bit lines BL1 to BLm. Even-numbered cell strings among the cell strings CS1 to CSm may be connected to the even bit lines, respectively. Odd-numbered cell strings among the cell strings CS1 to CSm may be connected to the odd bit lines, respectively.

Figure 7:
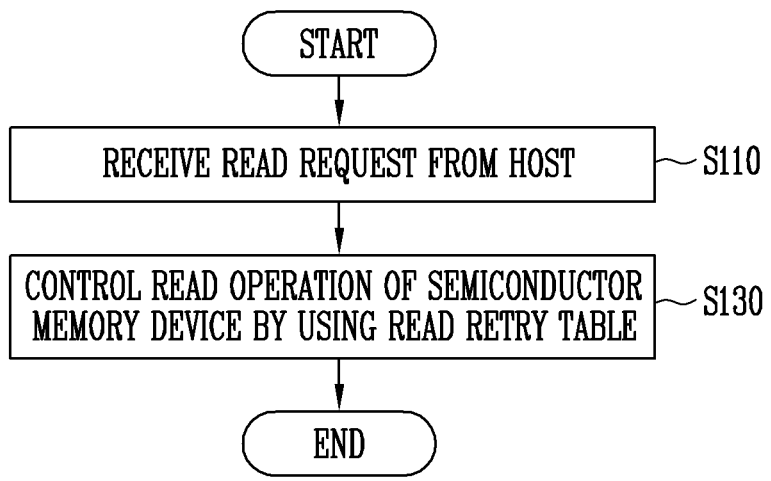
FIG. 7 illustrates an embodiment of a method of operating a controller.

FIG. 7 is a flowchart illustrating an operating method of controller 200 shown in FIG. 1 in accordance with an embodiment.

Referring to FIG. 7, the method includes, at S110, receiving a read request from the host and, at S130, controlling a read operation of the semiconductor memory device 100 by using a read retry table.

In operation S110, the memory system 1000 receives a read request from the host, e.g., controller 200 of the memory system 1000 may receive the read request from the host. Together with the read request, the controller 200 may receive a logical address at which read data is stored from the host. The controller 200 may translate the received logical address to a physical address. In a subsequent operation, the controller 200 may control the semiconductor memory device 100 to read data corresponding to the received read request based on the translated physical address.

In operation S130, the controller 200 may control a read operation of the semiconductor memory device 100 using a read retry table stored in the read retry table storage 250. Embodiments of operation S130 will be described with reference to FIGS. 8 to 10.

Figure 8:
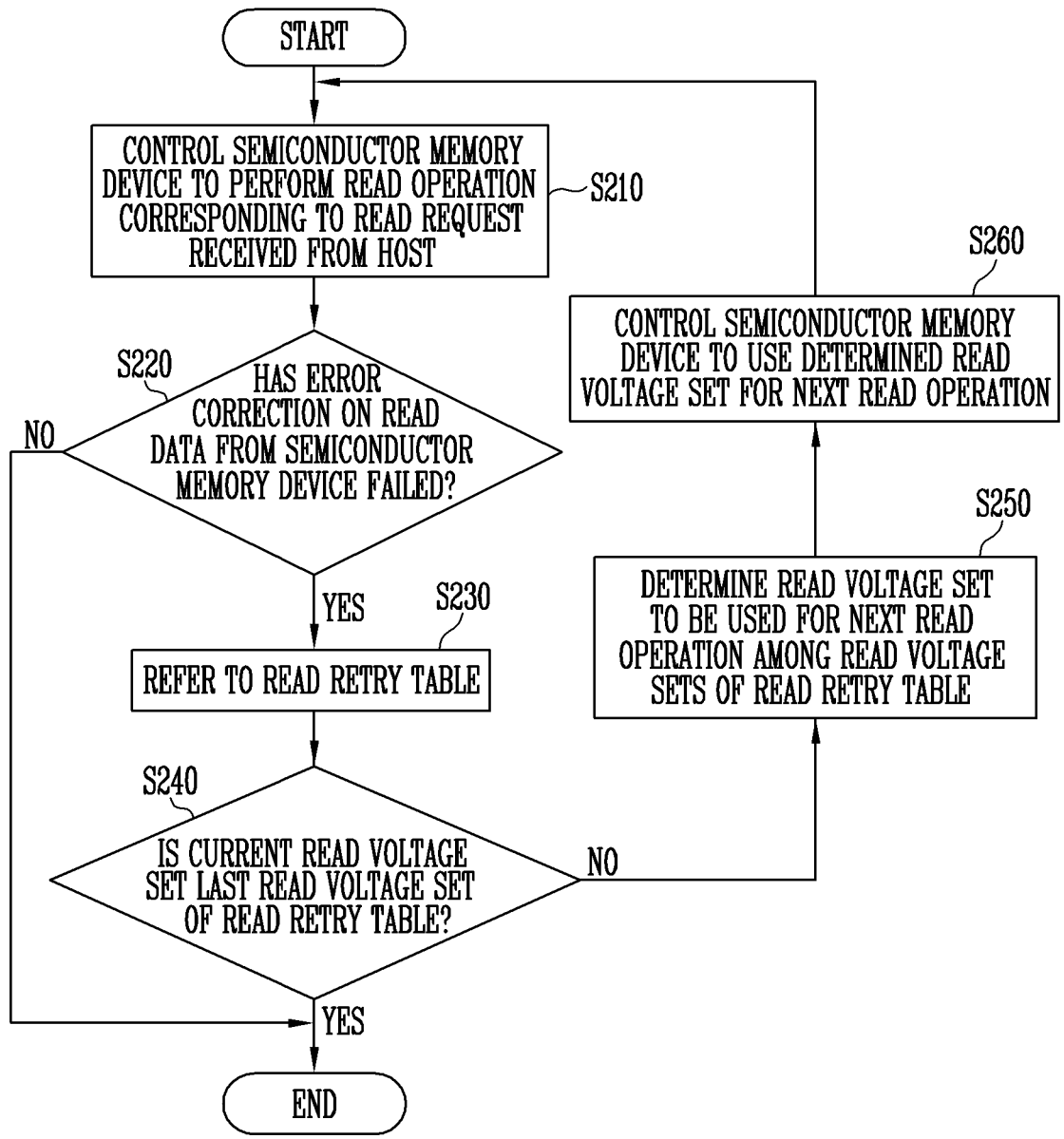
FIG. 8 illustrates an embodiment of a method of operating a controller.

FIG. 8 is a flowchart illustrating an embodiment of a method relating to operation S130 in FIG. 7. In accordance with this embodiment, operation S130 may include operations S210, S220, S230, S240, S250, and S260.

At S210, the controller 200 controls the semiconductor memory device 100 to perform a read operation corresponding to the read request from the host. To this end, the controller 200 may transfer, to the semiconductor memory device 100, a read command and a corresponding physical address. The semiconductor memory device 100 may perform a read operation on a page corresponding to the received physical address based on a currently set read voltage set, and may then transfer read data to the controller 200.

At S220, the error correction block 230 of the controller 200 performs an error correction operation on the read data received from the semiconductor memory device 100. When error correction succeeds as an error correction result (e.g., S220, No), the read data may be transferred to the host and the read operation may be ended.

At S230, when the error correction fails as an error correction result (e.g., S220, Yes), read voltage controller 210 refers to the read retry table stored in read retry table storage 250. In S230, the read voltage controller 210 may compare a read voltage set currently set in the semiconductor memory device 100 with read voltage sets in the read retry table.

At S240, when the read voltage set which is set in the semiconductor memory device 100 is not a last read voltage set among the read voltage sets in the read retry table (e.g., S240, No), the controller 200 may proceed to operation S250.

At S250, a read voltage set to be used for a next read operation is determined by sequentially selecting the read voltage sets in the read retry table. An example of a method for determining a read voltage set in operation S250 is described with reference to FIG. 10.

At S260, read voltage controller 210 controls the semiconductor memory device 100 to use the determined read voltage set for the next read operation. In S260, the read voltage controller 210 may set a read voltage set used for the read operation of the semiconductor memory device 100 using a set-parameter command. Subsequently, by again proceeding to operation S210, the controller 200 controls the semiconductor memory device 100 to perform a read operation corresponding to the read request received from the host.

When the read voltage set which is set in the semiconductor memory device 100 is the last read voltage set among the read voltage sets in the read retry table (e.g., S240, Yes), an error correction failure may be determined to have occurred even though the read operation was performed using all the read voltage sets stored in the read retry table. Therefore, the read operation is ended.

In one embodiment of FIG. 8, a read retry operation may include determining a read voltage set with reference to the read retry table and then repeatedly performing a read operation according to the determined read voltage set.

Figure 9A:
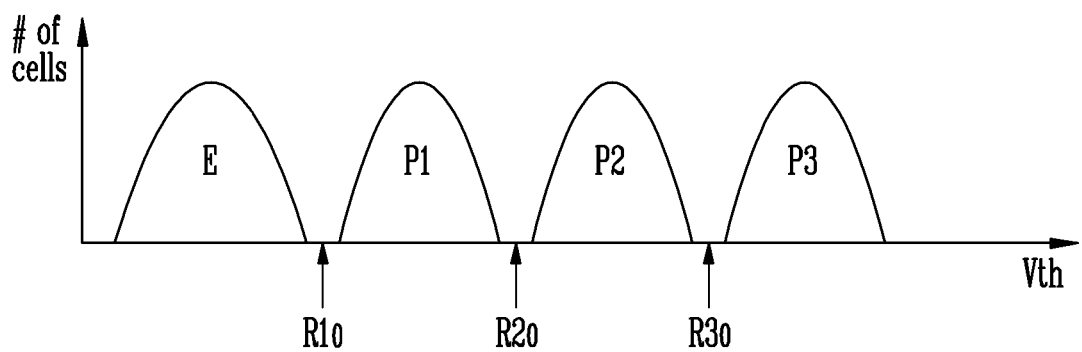
FIGS. 9A and 9B illustrates examples of why a read voltage set may change based on a change in threshold voltage distribution of memory cells.
Figure 9B:
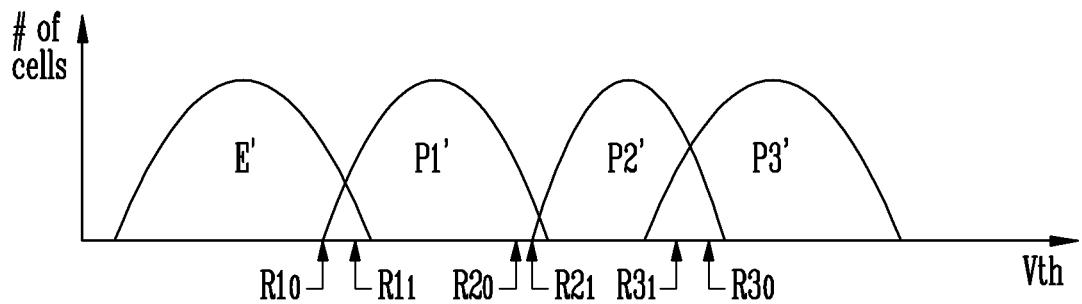

FIGS. 9A and 9B are graphs explaining examples of why a read voltage set may change based on a change in threshold voltage distribution of memory cells. A threshold voltage distribution of multi-level cells (MLCs) is exemplarily illustrated in FIGS. 9A and 9B.

Referring to FIG. 9A, a threshold voltage distribution of memory cells is illustrated just after a program operation is completed. As shown in FIG. 9A, a read margin between a threshold voltage distribution state of the memory cells (e.g., an erase state E and first to third program states P1 to P3) is sufficiently formed just after the program operation is completed. Accordingly, when a read operation is performed using first to third read voltages $R1_0$ to $R3_0$, a data read is possible without any error. The first to third read voltages $R1_0$ to $R3_0$ constitute one read voltage set. For example, a read voltage set may correspond to a set of read voltages used to perform a one-time data read operation.

Referring to FIG. 9B, a state is illustrated in which a threshold voltage distribution of the memory cells is changed when a certain time elapses after the program operation is completed. As shown in FIG. 9B, the threshold voltage distribution states of the memory cells may be changed when a certain time elapses after the program operation is completed. For example, a threshold voltage distribution of the erase state E and the first to third program states P1 to P3, which is shown in FIG. 9A, may be changed to that of an erase state E' and first to third program states P1' to P3', which is shown in FIG. 9B. In FIG. 9B, the threshold voltage distribution is degraded as compared with FIG. 9A, and therefore, an error may occur in the read operation.

When data of memory cells having the threshold voltage distribution shown in FIG. 9B is read using the first to third read voltages $R1_0$ to $R3_0$ (used for the read operation in FIG. 9A), a plurality of error bits may be included in the read data. When an error correction operation is performed on the read data, a case may occur where error correction is impossible. Accordingly, a read voltage set for data read may be changed.

When data of the memory cells having the threshold voltage distribution shown in FIG. 9B is read using changed first to third read voltages $R1_1$ to $R3_1$ shown in FIG. 9B, a smaller number of error bits may be generated compared with the case where data is read using the first to third read voltages $R1_0$ to $R3_0$. When an error correction operation is performed on the read data, error correction may be possible. For example, when a read operation is performed on memory cells corresponding to the changed threshold voltage distribution, error correction may be possible on read data when a read operation is performed using an appropriately changed read voltage set.

Degradation of the threshold voltage distribution of memory cells may be exhibited in a variety of aspects. The example shown in FIG. 9B is just one case where a change in threshold voltage distribution of the memory cells may occur. The threshold voltage distribution of the memory cells may be changed in various other aspects. Accordingly, variously changed read voltage sets may be used.

Figures 10, 11A:
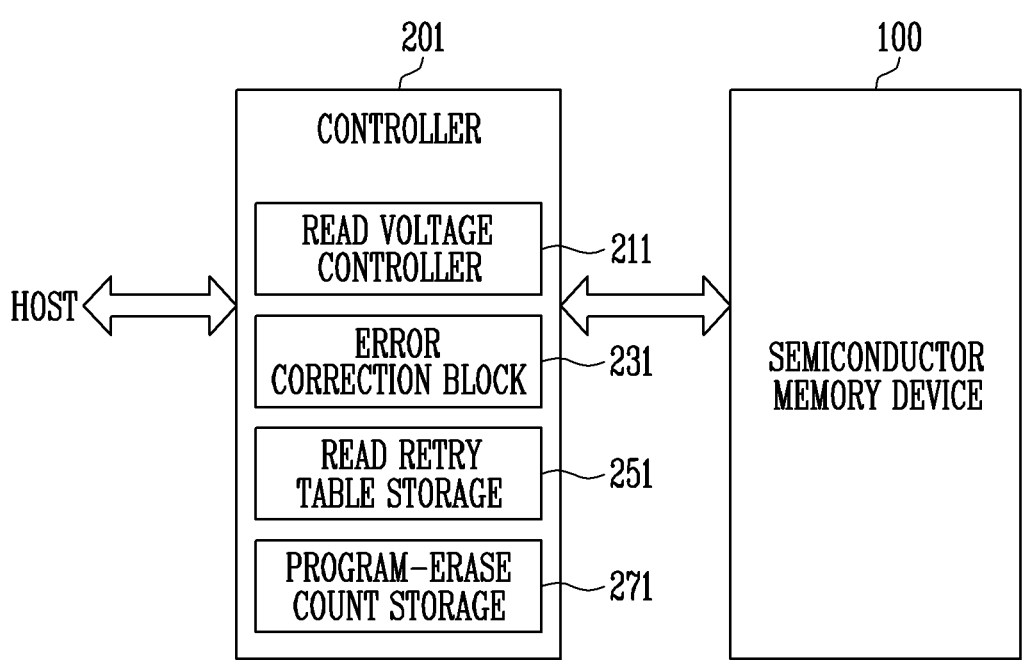
FIG. 10 illustrates an embodiment of a read retry table.
FIG. 11A illustrates an embodiment of a memory system including a controller.

FIG. 10 is a diagram exemplarily illustrating an embodiment of a read retry table. In this embodiment, the read retry table includes n read voltage sets, with each entry including a read voltage set and each read voltage set including three read voltages.

An entry of a first row may represent a read voltage set including a first read voltage R1_1, a second read voltage R2_1, and a third read voltage R3_1. An entry of a second row may represent a read voltage set including a first read voltage R1_2, a second read voltage R2_2, and a third read voltage R3_2. An entry of an nth row may represent a read voltage set including a first read voltage R1_n, a second read voltage R2_n, and a third read voltage R3_n.

When error correction on read data fails as a read operation result using a first read voltage set, controller 200 may control the semiconductor memory device 100 to perform the read operation using a second read voltage set. When error correction on read data fails as a read operation result using the second read voltage set, controller 200 may control the semiconductor memory device 100 to perform the read operation using a third read voltage set. The read operation may therefore be performed by sequentially applying read voltage sets in the read retry table until error correction on read data succeeds.

In an embodiment, when error correction on read data fails as a read operation result using a last read voltage set, controller 200 may determine that the read operation has finally failed. In one embodiment, when error correction on read data fails as a read operation result using a last read voltage set, controller 200 may determine a read voltage set to be used for the read operation through another manner instead of the read retry table. Also, controller 200 may control semiconductor memory device 100 to perform the read operation using the determined read voltage set.

In accordance with embodiments described with reference to FIGS. 7 to 10, when the read operation fails, the controller 200 controls the semiconductor memory device 100 to repeatedly perform the read operation by sequentially applying the read voltage sets from the first read voltage set to the last read voltage set in the read retry table. According to the read retry operation described with reference to FIGS. 7 to 10, a worn-out state of a memory block in the semiconductor memory device 100 or an error state of read data in data read is not reflected. Accordingly, the read operation is performed by sequentially applying the read voltage sets from the first read voltage set of the read retry table even when the worn-out state of the memory block is severe. In this case, an unnecessary read operation may be repeatedly performed, which results in decreasing read speed of the memory system 1000 and unnecessarily increasing read stress of memory cells in the semiconductor memory device 100.

In accordance with an embodiment, a read voltage set in the read retry table may be selected based on a read error related indicator, which provides an indication that an error correction failure has occurred. In one embodiment, the read error related indicator may include at least one of a worn-out state of a memory block in the semiconductor memory device 100 or an error state of read data in data read. For example, the read error related indicator may include at least one of a program-erase count value of a memory block in which read data is stored and an error bit rate of read data. One of a plurality of read voltage sets in the read retry table may be selected according to the read error related indicator. Thus, read speed of the memory system can be increased, and read stress of the memory cells in the semiconductor memory device can be reduced or minimized.

Figure 11B:
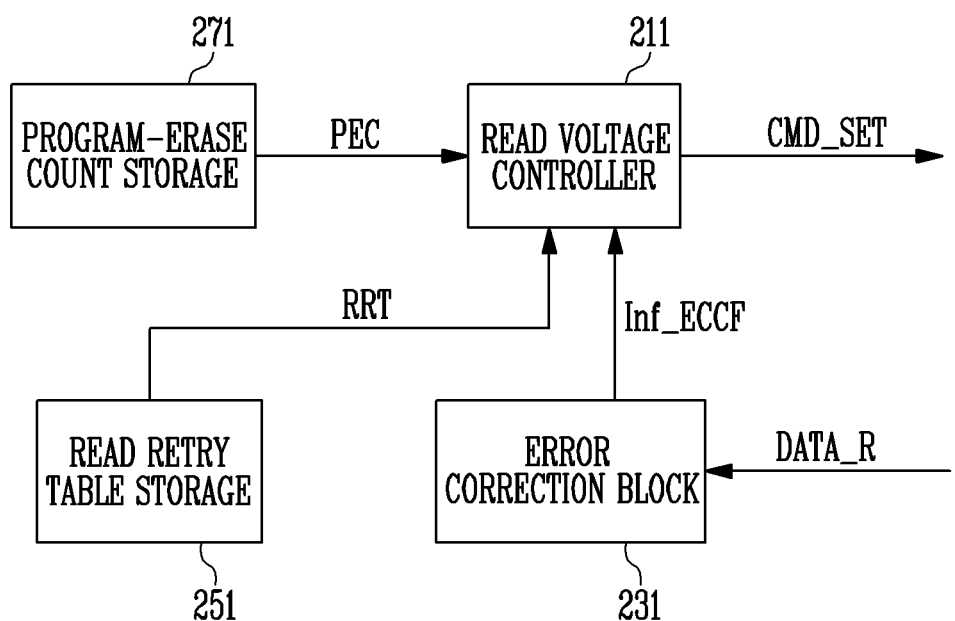
FIG. 11B illustrates an embodiment of operation of features of the controller.

FIG. 11A is a block diagram illustrating an embodiment of a memory system 1001 including a controller 201, and FIG. 11B is a block diagram illustrating an embodiment of the operation of features in the controller 201 shown in FIG. 11A.

Referring to FIG. 11A, in this embodiment the memory system 1001 includes a semiconductor memory device 100 and controller 201. The semiconductor memory device 100 shown in FIG. 11A may be, for example, the semiconductor memory device shown in FIG. 2.

The controller 201 includes a read voltage controller 211, an error correction block 231, a read retry table (RRT) storage 251, and a program-erase count storage 271. The read voltage controller 211, the error correction block 231, and the read retry table storage 251 of FIG. 11A may be, for example, the same as the read voltage controller 210, the error correction block 230, and the read retry table (RRT) storage 250 described with reference to FIG. 1.

The program-erase count storage 271 may store a program-erase count value of each of the memory blocks in the semiconductor memory device 100. A program-erase count value may be a value representing a number of times data is programmed and erased in a corresponding memory block. For example, a program-erase count value of a memory block may correspond to the number of times an erase operation is performed on the memory block.

In one embodiment, a program-erase count value of a memory block may be considered to be small when the number of times a program operation and an erase operation are performed on a corresponding memory block is small, e.g., below a predetermined reference value. A program-erase count value of a memory block may be considered large when the number of times a program operation and an erase operation are performed on a corresponding memory block is large, e.g., above a predetermined reference value. A small program-erase count may indicate that a memory block is not worn out, while a large program-erase count may indicate that a memory block is worn out, or at least more worn out that a memory block having a small program-erase count.

The program-erase count storage 271 may store a program-erase count value of each of the memory blocks in the semiconductor memory device 100. The program-erase count value of each memory block may be updated (e.g., by the controller) whenever an erase operation is performed on the memory block.

Program-erase count values which are stored and updated in the program-erase count storage 271 while the memory system 1001 is turned on may be programmed in a specific (or predetermined) area of the semiconductor memory device 100 before the memory system 1001 is turned off. When the memory system 1001 is turned off and turned on again, program-erase count values of the respective memory blocks may be read by the semiconductor memory device 100 for transfer to the controller 201. The controller 201 may store the program-erase count values transferred from the semiconductor memory device 100 in the program-erase count storage 271. Accordingly, although the turn-on and turn-off of the memory system 1001 are repeated, the program-erase count values of memory blocks in the semiconductor memory device 100 can be maintained in the program-erase count storage 271 in a latest state. An embodiment of the operation of controller 201 shown in FIG. 11A is described with reference to FIG. 11B.

Referring to FIG. 11B, first, the program-erase count storage 271 may provide the read voltage controller 211 with a program-erase count value PEC of a memory block in which data to be read is stored. The read retry table storage 251 may transfer a read retry table RRT including a plurality of read voltage sets to the read voltage controller 211. The error correction block 231 may perform an error correction operation on read data DATA_R received from the semiconductor memory device 100. When the error correction operation on the read data DATA_R fails, the error correction block 231 transfers error correction failure information Inf_ECCF to the read voltage controller 211. The read voltage controller 211 changes a read voltage of the semiconductor memory device 100 in response to the error correction failure information Inf_ECCF.

In one embodiment, the read voltage controller 211 may generate a set-parameter command CMD_SET for changing a read voltage set, and may transfer this command to the semiconductor memory device 100. The semiconductor memory device 100 changes a read voltage set used for a read operation in response to the set-parameter command CMD_SET. Subsequently, the controller 201 may transfer a read command to the semiconductor memory device 100. The semiconductor memory device 100 may then re-perform the read operation in response to the received read command.

In one embodiment, the read voltage controller 211 may determine a read voltage set used for a read operation of the semiconductor memory device 100 among a plurality of read voltage sets in the read retry table RRT. This determination may be made based on the program-erase count value PEC. An embodiment of this operating method of the controller 201 is described with reference to FIG. 12.

Figure 12:
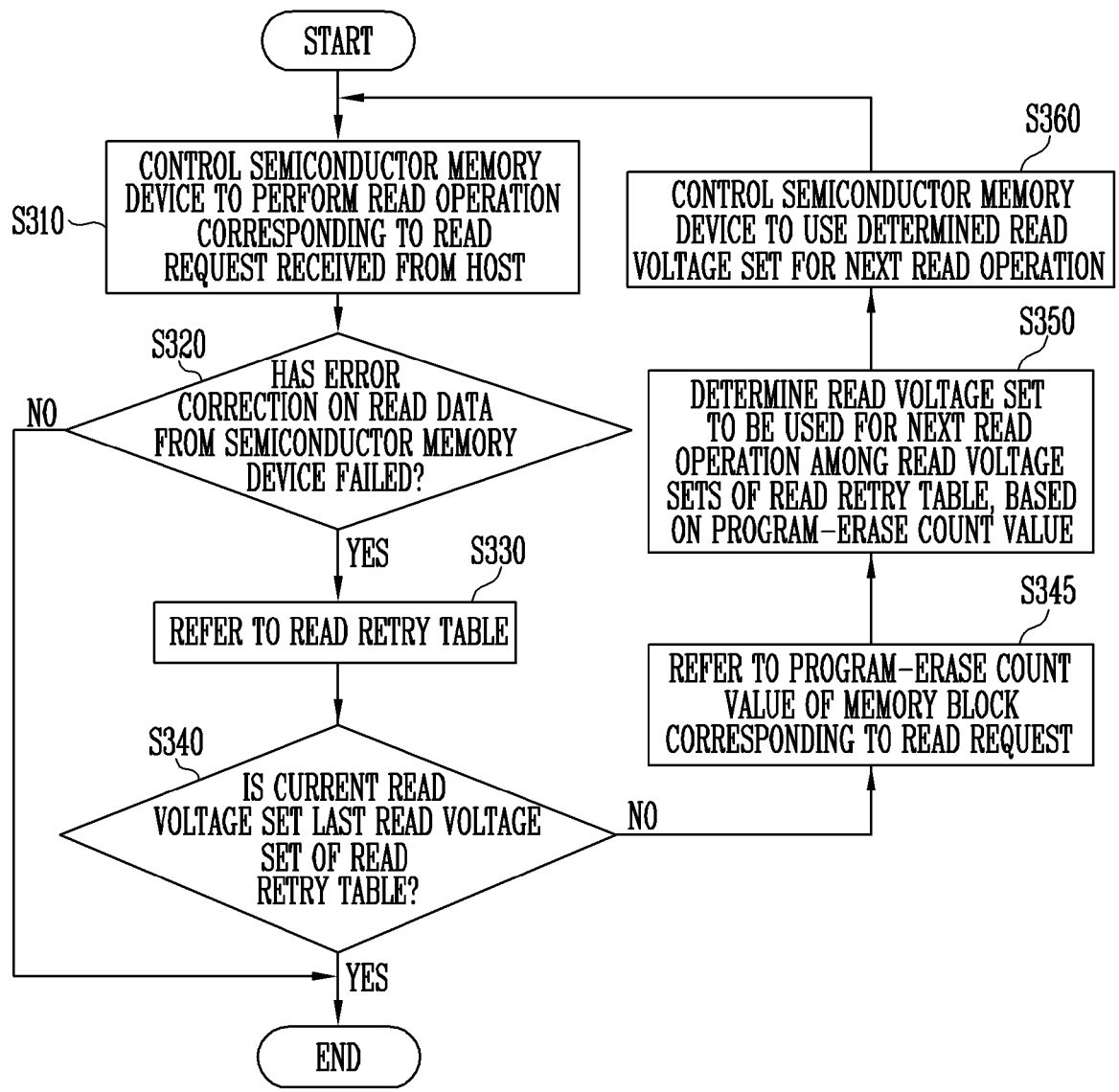
FIG. 12 illustrates an embodiment of a method of operating a controller.

FIG. 12 is a flowchart illustrating an embodiment of an operating method of the controller shown in FIG. 11A, which method includes an example of operation S130 in FIG. 7. In accordance with this embodiment, operation S130 in FIG. 7 includes operations S310, S320, S330, S340, S345, S350, and S360.

At S310, the method include the controller 201 controlling the semiconductor memory device 100 to perform a read operation corresponding to a read request received, for example, from a host. To this end, the controller 201 may transfer, to the semiconductor memory device 100, a read command and a corresponding physical address. The semiconductor memory device 100 may perform a read operation on a page corresponding to the received physical address, based on a read voltage set currently set therein, and may transfer read data to the controller 201.

At S320, error correction block 231 of the controller 201 performs an error correction operation on the read data received from the semiconductor memory device 100. When error correction succeeds as an error correction result (e.g., S320, No), the read data may be transferred to the host and the read operation may be ended. When the error correction fails as an error correction result (e.g., S320, Yes), error correction block 231 transfers error correction failure information Inf_ECCF to the read voltage controller 211.

At S330, the read voltage controller 211 may refer to a read retry table RRT stored in the read retry table storage 251 in response to the error correction failure information Inf_ECCF. For example, in operation S330, the read voltage controller 211 may compare the read voltage set currently set in the semiconductor memory device 100 with read voltage sets included in the read retry table.

At S340, when the read voltage set (which is set in the semiconductor memory device 100) is not a last read voltage set among the read voltage sets in the read retry table (e.g., S340, No), the controller 201 proceeds to operation S345.

At S345, the read voltage controller 211 refers to a program-erase count value PEC. As described above, the program-erase count value PEC may be considered one of read error related indicators in an embodiment.

At S350, the read voltage controller 211 determines a read voltage set to be used for a next read operation in the read retry table RRT based on the program-erase count value PEC. An example of a method for determining a read voltage set in operation S350 is described with reference to FIGS. 13 and 14.

At S360, read voltage controller 211 controls the semiconductor memory device 100 to use the determined read voltage set for the next read operation. For example, in operation S360, the read voltage controller 211 may set a read voltage set used for the read operation of the semiconductor memory device 100. Subsequently, by again proceeding to operation S310, controller 201 controls the semiconductor memory device 100 to perform the read operation corresponding to the read request from the host.

When the read voltage set (which is set in the semiconductor memory device 100) is the last read voltage set among the read voltage sets in the read retry table in accordance with a determination result of operation S340 (e.g., S340, Yes), an error correction failure may be determined to have occurred even though the read operation was performed using all the read voltage sets stored in the read retry table. Therefore, the read operation is ended.

FIG. 13 is a diagram illustrating an embodiment of a read retry table which may be used in the operating method shown in FIG. 12. Similarly to FIG. 10, the read retry table includes n read voltage sets. Each entry in the read retry table shown in FIG. 13 may include a read voltage set, and each read voltage set may include three read voltages.

In one embodiment, an entry of a first row may represent a read voltage set including a first read voltage R1_1, a second read voltage R2_1, and a third read voltage R3_1. An entry of a second row may represent a read voltage set including a first read voltage R1_2, a second read voltage R2_2, and a third read voltage R3_2. An entry of an nth row may represent a read voltage set including a first read voltage R1_n, a second read voltage R2_n, and a third read voltage R3_n.

Each entry of the read retry table shown in FIG. 13 belongs to one of first to kth read voltage set groups RSG1 to RSGk. For example, the read voltage sets in the read retry table may be grouped into the first to kth read voltage set groups RSG1 to RSGk. In the example shown in FIG. 13, each read voltage set group includes five read voltage sets, e.g., the first read voltage set group RSG1 includes first to fifth read voltage sets. The first read voltage set includes the first to third read voltages R1_1, R2_1, and R3_1. The second read voltage set includes the first to third read voltages R1_2, R2_2, and R3_2. In this manner, the fifth read voltage set includes first to third read voltages R1_5, R2_5, and R3_5. The second read voltage set group RSG2 includes sixth to tenth read voltage sets. Each read voltage set group may include a different number(s) of read voltage sets in other embodiments.

In one embodiment of the controller 201 and the operating method thereof, a read voltage set to be used for a next read operation may be selected based on a program-erase count value of a memory block which becomes a target of the read operation. Embodiments are described with reference to FIGS. 12 to 14.

Figure 14:
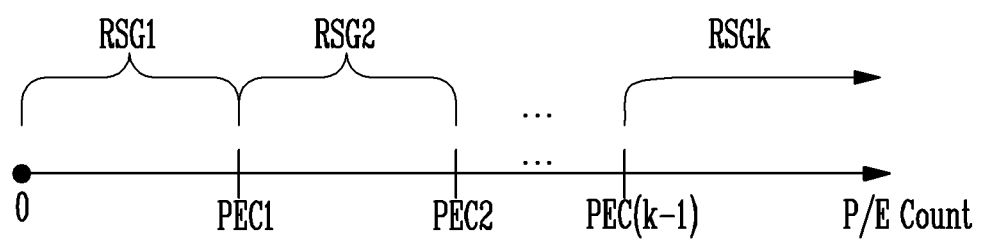
FIG. 14 illustrates an embodiment for selecting a read voltage set group according to a program-erase count value of a memory block.

FIG. 14 is a graph illustrating selection of a read voltage set group based on a program-erase count value P/E count of a memory block, in accordance with an embodiment.

Referring to FIG. 14, when the program-erase count value of the memory block is greater than or equal to a predetermined value (e.g., 0) and is less than a first program-erase count PEC1, the first read voltage set group RSG1 is selected. When the program-erase count value of the memory block is greater than or equal to the first program-erase count PEC1 and is less than a second program-erase count PEC2, the second read voltage set group RSG2 is selected. In this manner, when the program-erase count value is greater than or equal to a (k-2)th program-erase count PEC(k-2) and is less than a (k-1)th program-erase count PEC(k-1), the (k-1)th read voltage set group RSG(k-1) is selected. Finally, when the program-erase count value of the memory block is greater than or equal to the (k-2)th program-erase count PEC(k-1), the kth read voltage set group RSGk is selected.

Referring to FIGS. 12 to 14 together, at S310, the controller 201 controls the semiconductor memory device 100 to perform a read operation corresponding to a read request received from the host. At S320, a determination is made as to whether error correction on read data received from the semiconductor memory device 100 has failed. At S330, when error correction on read data received from the semiconductor memory device 100 has failed as a result obtained by performing an initial read operation corresponding to the request (e.g., S320, Yes), the controller 201 refers to a read retry table.

At S340, the controller 201 determines whether a current read voltage set is a last read voltage set of the read retry table. When the read operation corresponding to the received read request has been initially performed, the current read voltage set is not the last read voltage set of the read retry table (S340, No). Accordingly, at S345, the read voltage controller 211 refers to a program-erase count value of a memory block corresponding to the read request.

At S350, the read voltage controller 211 determines a read voltage set to be used for a next read operation based on the program-erase count value. In operation S350, a read voltage set group may be determined according to the method shown in FIG. 14, and a first read voltage set among read voltage sets in the determined read voltage set group may be determined as a start point used for a read retry operation.

For example, controller 201 refers to a program-erase count value of a memory block corresponding to the read request, and determines an initial read voltage set to be selected in the read retry operation, based on the program-erase count value. In an example, when the program-erase count value of the memory block corresponding to the read request is greater than or equal to the first program-erase count PEC1 and is less than the second program-erase count PEC2, the second read voltage set RSG2 is selected. Accordingly, selection of the read voltage set used in the read retry operation is started from the sixth read voltage set.

The first to fifth read voltage sets are not selected in the read retry operation. Therefore, when an error correction operation on read data corresponding to the initial read operation fails, the sixth read voltage set as a first read voltage set in the second read voltage set group RSG2 is determined as a read voltage set to be used for a next read operation. When an error correction operation on received read data fails as a read operation result using the sixth read voltage set, the seventh read voltage set is determined as a read voltage set to be used for a next read operation. In this manner, read voltage sets are sequentially selected from the sixth read voltage set to the nth read voltage set.

In one example, when the program-erase count value of the memory block corresponding to the read request is greater than or equal to the second program-erase count PEC2 and is less than a third program-erase count PEC3, the third read voltage set group RSG3 is selected. Accordingly, selection of the read voltage set used for the read retry operation is started from an eleventh read voltage set. The first to tenth read voltage sets are not selected in the read retry operation. Therefore, when the error correction operation on the read data corresponding to the initial read operation fails, the eleventh read voltage set as a first read voltage set in the third read voltage set group RSG3 is determined as a read voltage set to be used for a next read operation. When an error correction operation on received read data fails as a read operation result using the eleventh read voltage set, a twelfth read voltage set is determined as a read voltage set to be used for a next read operation. In this manner, read voltage sets are sequentially selected from the eleventh read voltage set to the nth read voltage set.

Referring to operation S340 shown in FIG. 12, when a current read voltage set is the last read voltage set of the read retry table, the read operation is ended. For example, under a condition in which the error correction failure is continued, the read retry operation may be repeatedly performed until the read voltage set becomes the last read voltage set. In an example, when the program-erase count value of the memory block corresponding to the read request is greater than or equal to the second program-erase count PEC2 and is less than the third program-erase count PEC3, the read operation may be repeatedly performed (n-10) times from the eleventh read voltage set to the nth read voltage set, under a condition in which the error correction operation continuously fails.

In one embodiment, the read retry operation may be performed only in a read voltage set group corresponding to the program-erase count value. For example, when the program-erase count value of the memory block corresponding to the read request is greater than or equal to the second program-erase count PEC2 and is less than the third program-erase count PEC3, the read operation may be repeatedly performed only five times from the eleventh read voltage set to a fifteenth read voltage set, under a condition in which the error correction operation continuously fails.

Instead of operation S340, whether the read operation is to be ended or whether the controller 201 is to proceed to operation S345 may be determined by determining whether the current read voltage set is a last read voltage set of the read voltage set group corresponding to the program-erase count value.

In an embodiment, each read voltage set of the read retry table may be aligned in a state in which the value of a first read voltage R1 is sequentially increased. For example, in the read retry table shown in FIG. 13, the first read voltage R1_2 in the second read voltage set may be greater than the first read voltage R1_1 in the first read voltage set. In addition, the first read voltage R1_3 in the third read voltage set may be greater than the first read voltage R1_2 in the second read voltage set. In this manner, the read voltage sets may be aligned such that the first read voltage R1_1 in the first read voltage set to the first read voltage R1_n included in the nth read voltage set are gradually increased. For example, the read voltage sets of the read retry table may be aligned in an ascending order with respect to the value of the first read voltage R1. An example reason why the read voltage sets of the read retry table are aligned is described with reference to FIG. 15.

Figure 15:
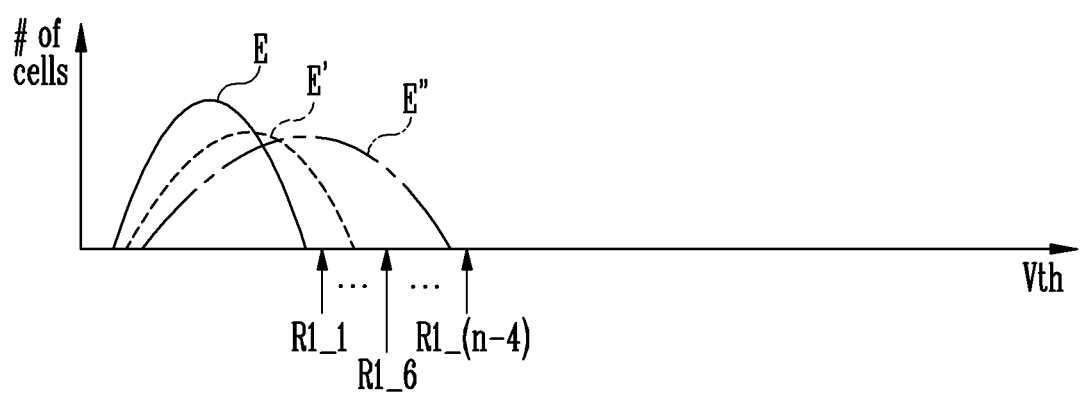
FIG. 15 illustrates an embodiment of a threshold voltage distribution of an erase state of memory cells according to a program-erase count value.

FIG. 15 is a graph illustrating an example of a threshold voltage distribution of an erase state of memory cells according to a program-erase count value. In FIG. 15, illustration of a threshold voltage distribution of the first to third program states P1 to P3 is omitted.

Referring to FIG. 15, the threshold voltage distribution of memory cells of the erase state is shifted to the right according to the program-erase count value. For example, when the program-erase count value is greater than or equal to 0 and is less than the first program-erase count PEC1, threshold voltages of the memory cells of the erase state are distributed such as a state E. When the program-erase count value is greater than or equal to the first program-erase count PEC1 and is less than the second program-erase count PEC2, threshold voltages of the memory cells of the erase state are distributed such as a state E'. When the program-erase count value is greater than or equal to the (k-1)th program-erase count PEC(k-1), threshold voltages of the memory cells of the erase state are distributed such as a state E".

Therefore, the first read voltage may be increased as the program-erase count value of a memory bock is increased. For example, as shown in FIG. 15, in order to identify the threshold voltage distribution of the memory cells of the erase state E when the program-erase count value is greater than or equal to 0 and is less than the first program-erase count PEC1, read voltages may be used from the first read voltage R1_1 of the first read voltage set in the read retry operation. In order to identify the threshold voltage distribution of the memory cells of the erase state E' when the program-erase count value is greater than or equal to the first program-erased count PEC1 and is less than the second program-erase count PEC2, read voltages may be used from the first read voltage R1_6 of the sixth read voltage set in the read retry operation. In this manner, in order to identify the threshold voltage distribution of the memory cells of the erase state E" when the program-erase count value is greater than or equal to the (k-1)th program-ease count PEC(k-1), read voltages may be used from the first read voltage R1_(n-4) of the (n-4)th read voltage set in the read retry operation.

Accordingly, the read voltage sets in the read retry table may be aligned such that a value of the first read voltage R1 increases as consecutive numbers of the read voltage sets increase.

When the read voltage sets of the read retry table stored in the read retry table storage 251 are not aligned according to the above-described reference, the operating method of the controller in accordance with an embodiment may further include an operation of preferentially aligning the read voltage sets of the read retry table as described above. An example will be described with reference to FIG. 16.

Figure 16:
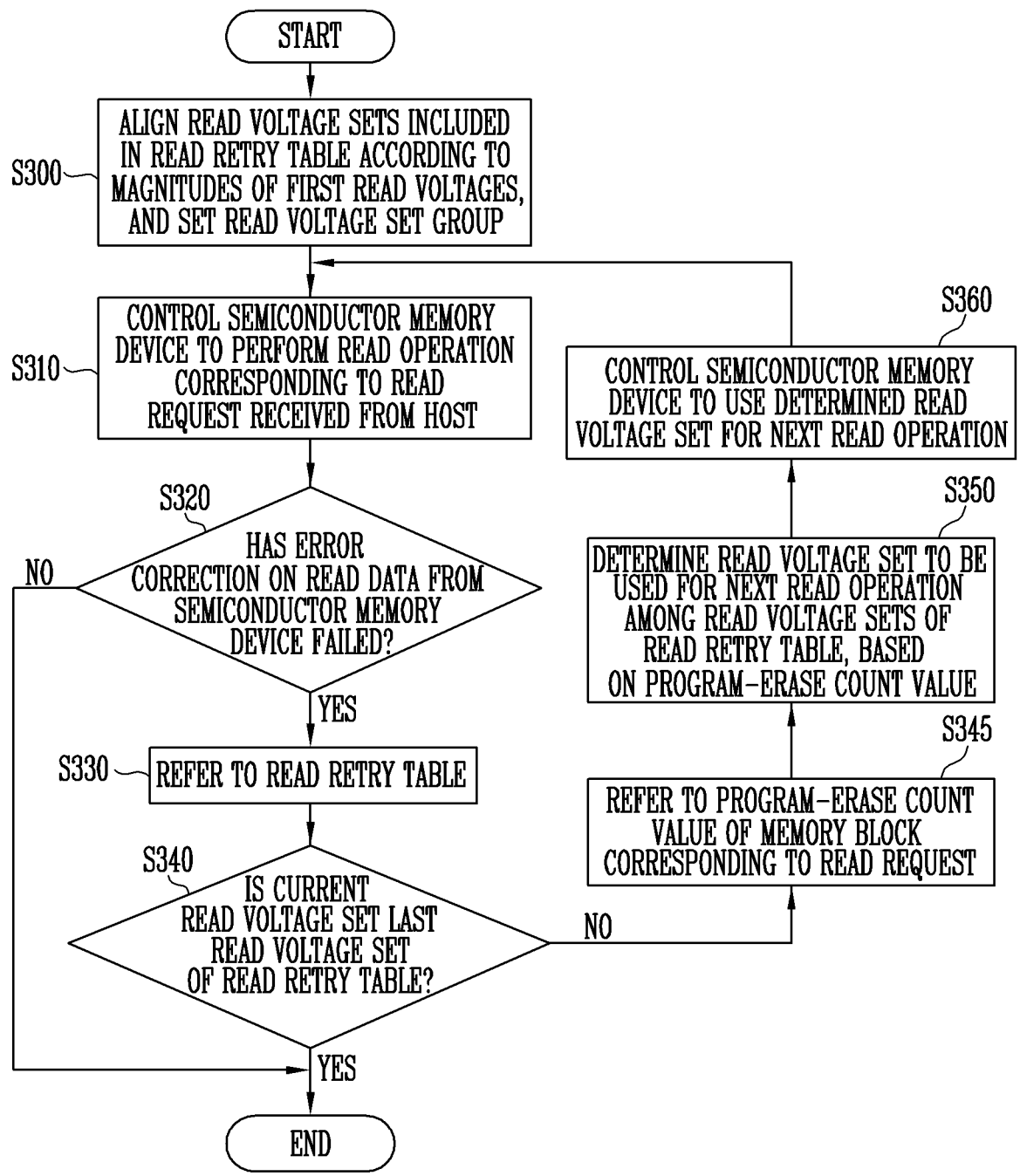
FIG. 16 illustrates an embodiment of a method of operating of a controller.

FIG. 16 is a flowchart illustrating an embodiment of an operating method of the controller 201 shown in FIG. 11A. The operating method of FIG. 16 may be the same as the operating method of FIG. 12, except that the method of FIG. 16 further includes operation S300. That is, the operating method of FIG. 16 includes operations S310, S320, S330, S340, S345, S350, and S360 shown in FIG. 12 as they are.

In S300, the controller 201 may align read voltage sets in the read retry table according to magnitudes of first read voltages R1, and may set read voltage set groups with respect to the aligned read voltage sets. As described above, when the read voltage sets in the read retry table are not aligned with respect to the first read voltage R1, the controller 201 may align the read voltage sets and then set the read voltage set group in operation S300. In operation S300, read voltage sets which are not aligned may be aligned in a predetermined order (e.g., an ascending order) with respect to the first read voltage R1. Accordingly, the read voltage sets of the read retry table may be aligned as shown in FIG. 13, e.g., the read voltage sets may be aligned such that the first read voltages R1_1 to R1_n have values which gradually increase, e.g., increase at a predetermined rate below a reference value.

Subsequently, the read voltage set groups RSG1 to RSGn are set with respect to the aligned read voltage sets. Accordingly, five read voltage sets having a lowest first read voltage R1 are in the first read voltage set group RSG1. Five read voltage sets having a lowest first read voltage R1 (among the other read voltage sets except the read voltage sets in the first read voltage set group RSG1) are in the second read voltage set group RSG2. In this manner, in operation S300, the controller 201 may generate a read retry table in which the read voltage sets are aligned with respect to the first read voltage. The generated read retry table is stored in the read retry table storage 251. Operations continued after S300 may be performed in a same manner as described with reference to FIG. 12.

Figure 17:
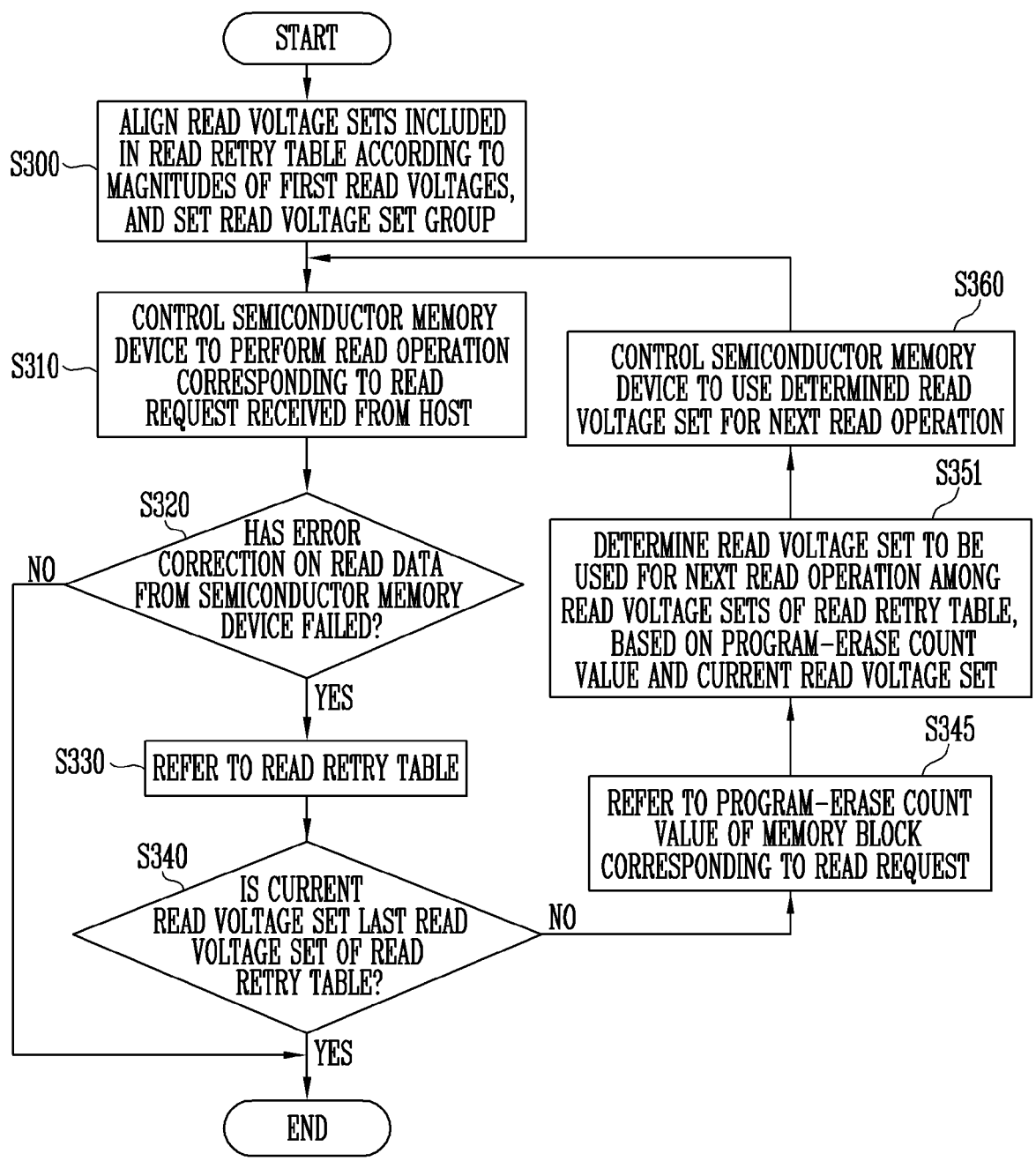
FIG. 17 illustrates an embodiment of a method of operating a controller.

FIG. 17 is a flowchart illustrating an embodiment of an operating method of the controller 201 shown in FIG. 11A. The method of FIG. 17 may be the same as the method of FIG. 16, except that operation S351 is performed instead of operation S350.

In operation S351, the controller 201 determines a read voltage set to be used for a next read operation (among the read voltage sets of the read retry table) based on a program-erase count value and a current read voltage set. In operation S351, controller 201 may determine a read voltage set to be used for a next read operation based on whether the program-erase count value exceeds a predetermined reference value. An example embodiment is described with reference to FIG. 18.

FIG. 18 is a diagram illustrating an embodiment of operation S351 shown in FIG. 17. In order to perform operation S351 shown in FIG. 17, at S352, the controller 201 may select a read voltage set group corresponding to the program-erase count value among a plurality of read voltage set groups. In this process, controller 201 may select the read voltage set group in the same manner described with reference to FIGS. 13 and 14. For example, when a program-erase count value of a memory block as a current read target is greater than or equal to the first program-erase count PEC1 and is less than the second program-erase count PEC2, the second read voltage set group RSG2 is selected.

At S353, controller 201 compares the program-erase count value of the memory block as the read target with a predetermined reference value.

At S354, controller 201 determines whether the program-erase count value is greater than or equal to the reference value.

At S355, when the program-erase count value is greater than or equal to the reference value (e.g., S354, Yes), controller 201 may select a read voltage set having a minimum average distance with respect to a current read voltage set among the read voltage sets in the read voltage set group selected in operation S352.

At S356, when the program-erase count value is less than the reference value (e.g., S354, No), controller 201 may select a read voltage set including a first read voltage having a minimum distance with respect to a first read voltage of the current read voltage set, among the read voltage sets in the read voltage set group selected in operation S352. An embodiment of operation S355 is described with reference to FIG. 19A, and an embodiment of operation S356 is described with reference to FIG. 19B.

FIGS. 19A and 19B are diagrams respectively illustrating embodiment of operations S355 and S356 shown in FIG. 18. An example where the second read voltage set group RSG2 is selected in operation S352 is illustrated in FIG. 19A, and where the second read voltage set group RSG2 includes the sixth to tenth read voltage sets.

Referring to FIG. 19A, average distances AVG distance are recorded corresponding to the sixth to tenth read voltage sets belong to the second read voltage set group RSG2, among the n read voltage sets belonging to the read retry table. Average distances corresponding to read voltage sets of unselected read voltage set groups will not be used in this example. Therefore, the average distances corresponding to the read voltage sets of unselected read voltage set groups may not be calculated.

An average distance corresponding to each read voltage set in the second read voltage set group RSG2, which is recorded in FIG. 19A, may be derived by Equation 1.

$$ad\_i = \Sigma_{k=1}^{3} |Rk\_i - Rk\_pr| \qquad (1)$$

where R1_pr, R2_pr, and R3_pr may correspond to a read voltage set used for the read operation of the semiconductor memory device in operation S310 shown in FIG. 17. That is, in this example, R1_pr, R2_pr, and R3_pr correspond to the current read voltage set in operation S355 of FIG. 18.

Consider, for example, ad_6 which is an average distance corresponding to a first read voltage set among the read voltage sets in the second read voltage set group RSG2. In this case, ad_6 may be calculated by Equation 1 as follows: |R1_6–R1_pr|+|R2_6–R2_pr|+|R3_6–R3_pr|. Also consider ad_7, which is an average distance corresponding to a second read voltage set among the read voltage sets in the second read voltage set group RSG2. In this case, ad_7 may be calculated by Equation 1 as follows: |R1_7–R1_pr|+|R2_7–R2_pr|+|R3_7–R3_pr|.

After average distances ad_6 to ad_10 corresponding to the respective read voltage sets in the second read voltage set group RSG2 are derived, a read voltage set having a predetermined (e.g., smallest) average distance among the average distances may be selected. Therefore, the read voltage set having the smallest average distance may be determined as a read voltage set RVS_next to be used for a next read operation. The read voltage set RVS_next to be used for the next read operation may be selected by Equation 2.

$$RVS\_next = \arg\left[\min_{i=6\sim10} ad\_i\right] \qquad (2)$$

As shown in Equation 2, a read voltage set corresponding to the smallest average distance among the average distances ad_6 to ad_10 corresponding to the respective read voltage sets in the second read voltage set group RSG2 is determined as the read voltage set RVS_next to be used for the next read operation. For example, when the average distance ad_8 among the average distances ad_6 to ad_10 has a smallest value, a read voltage set R1_8, R2_8, and R3_8 corresponding to the average distance ad_8 may be determined as read voltage set RVS_next to be used for the next read operation.

Similarly to FIG. 19A, an example in which the second read voltage set group RSG2 is selected in operation S352 is illustrated in FIG. 19B. The second read voltage set group RSG2 includes the sixth to tenth read voltage sets.

Referring to FIG. 19B, R1 distance corresponding to the sixth to tenth read voltage sets belonging to the second read voltage set group RSG2 among the n read voltage sets belonging to the read retry table are recorded. An R1 distance corresponding to each read voltage set in the second read voltage set group RSG2, which is recorded in FIG. 19A, may be derived by Equation 3:

$$d\_i = |R1\_i - R1\_pr| \qquad (3)$$

Like Equation 1, in Equation 3, R1_pr, R2_pr, and R3_pr may correspond to a read voltage set used for the read operation of the semiconductor memory device in operation S310 shown in FIG. 17. That is, R1_pr, R2_pr, and R3_pr correspond to the current read voltage set described in operation S355 shown in FIG. 18.

For example, in the case of d_6 as an R1 distance corresponding to a first read voltage set among the read voltage sets in the second read voltage set group RSG2, d_6 may be calculated by Equation 3 as follows: |R1_6–R1_pr|. Similarly, in the case of d_7 as an R1 distance corresponding to a second read voltage set among the read voltage sets in the second read voltage set group RSG2, d_7 may be calculated by Equation 3 as follows: |R1_7–R1_pr|.

After R1 distances d_6 to d_10 corresponding to the respective read voltage sets in the second read voltage set group RSG2 are derived, a read voltage set having a predetermined (e.g., smallest) R1 distance may be selected. Therefore, the read voltage set having the smallest R1 distance may be determined as a read voltage set RVS_next to be used for a next read operation. The read voltage set RVS_next to be used for the next read operation may be selected by Equation 4.

$$RVS\_next = \arg\left[\min_{i=6\sim10} d\_i\right] \qquad (4)$$

As shown in Equation 4, a read voltage set corresponding to the smallest R1 distance (among the R1 distances d_6 to d_10 corresponding to the respective read voltage sets in the second read voltage set group RSG2) is determined as the read voltage set RVS_next to be used for the next read operation. For example, when the R1 distance d_7 among the R1 distances d_6 to d_10 has a smallest value, a read voltage set R1_7, R2_7, and R3_7 corresponding to the R1 distance d_7 may be determined as read voltage set RVS_next to be used for the next read operation.

Figure 20A:
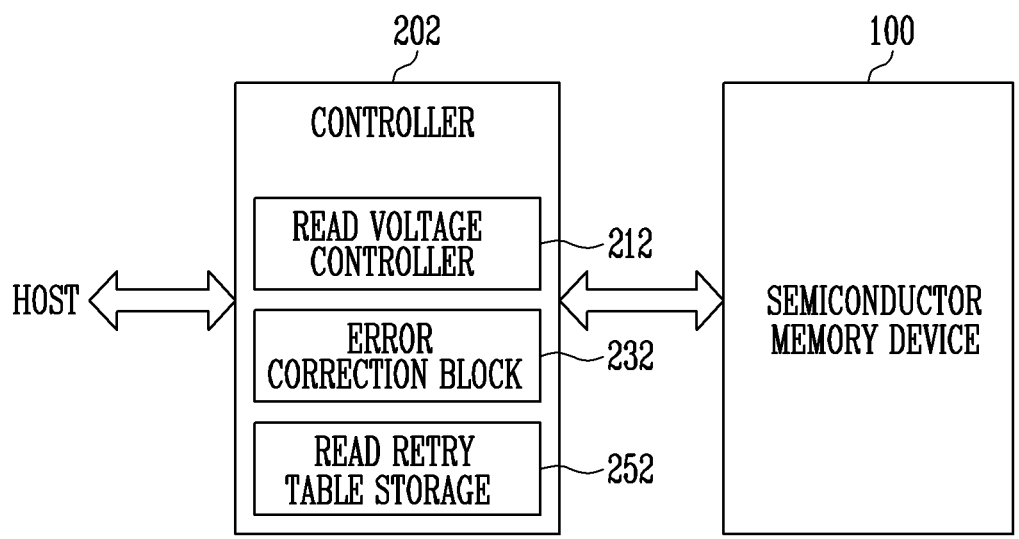
FIG. 20A illustrate an embodiment of a memory system including a controller.
Figure 20B:
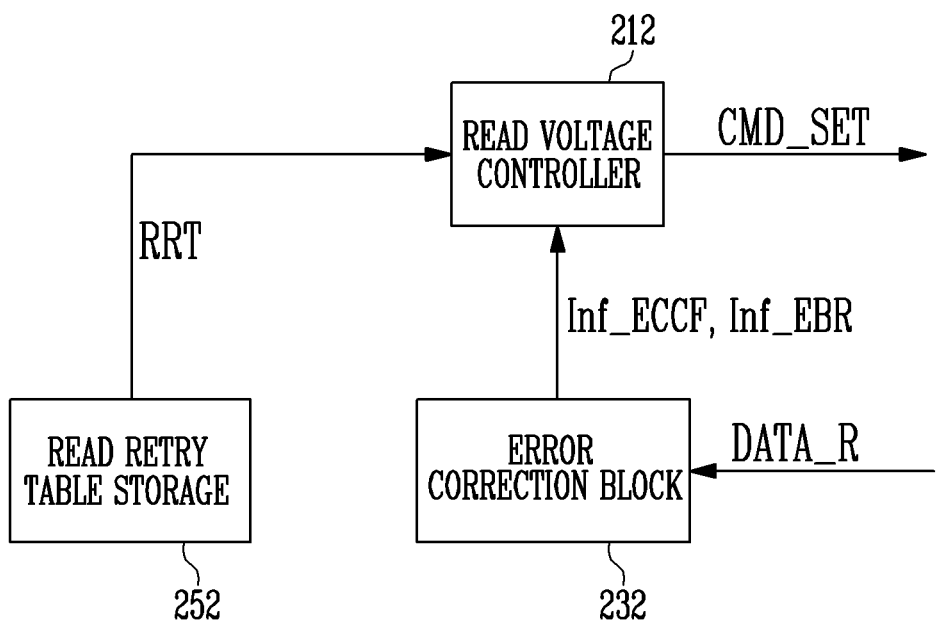
FIG. 20B illustrates an embodiment of an operation of features in the controller shown in FIG. 20A.

FIG. 20A is a block diagram illustrating an embodiment of a memory system 1002 including a controller 202, and FIG. 20B is a block diagram illustrating an embodiment of an operation of features of the controller 202 shown in FIG. 20A.

Referring to FIG. 20A, the memory system 1002 in accordance with the still another embodiment of the present disclosure includes a semiconductor memory device 100 and the controller 202. The semiconductor memory device 100 shown in FIG. 20A may be the semiconductor memory device shown in FIG. 2.

Referring to FIG. 20A, the controller 202 includes a read voltage controller 212, an error correction block 232, and a read retry table (RRT) storage 252. The read voltage controller 212, the error correction block 232, and the read retry table storage 252, which are shown in FIG. 20A, may be, for example, the same as the read voltage controller 210 or 211, the error correction block 230 or 231, and the read retry table (RRT) storage 250 or 251 described with reference to FIG. 1 or 11A.

Referring to FIG. 20B, the read retry table storage 252 may transfer a read retry table RRT including a plurality of read voltage set to the read voltage controller 212. The error correction block 232 may perform an error correction operation on read data DATA_R received from the semiconductor memory device 100. When the error correction operation on the read data DATA_R fails, the error correction block 232 transfers error correction failure information Inf_ECCF and error bit rate information Inf_EBR to the read voltage controller 212. The error bit rate information Inf_EBR may be information representing a rate of error bits in the read data DATA_R.

In an example, the error correction block 232 may perform the error correction operation through a Low Density Parity Check (LDPC) code. A syndrome weight may be generated in a process in which the error correction block 232 decodes a codeword through the LDPC code. The error bit rate information Inf_EBR may include an error bit rate predicted from the syndrome weight. However, this is merely an example and an error bit rate of the codeword may be calculated or estimated based on other types of error correction methods. The error correction block 232 may generate error bit rate information Inf_EBR quantitatively representing the error bit rate calculated or estimated described above, and may transfer the generated error bit rate information Inf_EBR to read voltage controller 212.

The read voltage controller 212 changes a read voltage of the semiconductor memory device 100 in response to the error correction failure information Inf_ECCF. For example, the read voltage controller 212 generates a set-parameter command CMD_SET for changing the read voltage set and then transfers this command to the semiconductor memory device 100. The semiconductor memory device 100 changes a read voltage set used for a read operation in response to the set-parameter command CMD_SET. Subsequently, the controller 202 may transfer a read command to the semiconductor memory device 100, and the semiconductor memory device 100 may re-perform the read operation in response to the received read command.

In one embodiment of the controller 202, the read voltage controller 212 may determine a read voltage set to be used for the read operation of the semiconductor memory device 100, among a plurality of read voltage sets in the read retry table RRT, based on the error bit rate information Inf_EBR. As described above, the error bit rate is considered as one of read error related indicators. An embodiment of an operating method of the controller 202 is described with reference to FIG. 21.

Figure 21:
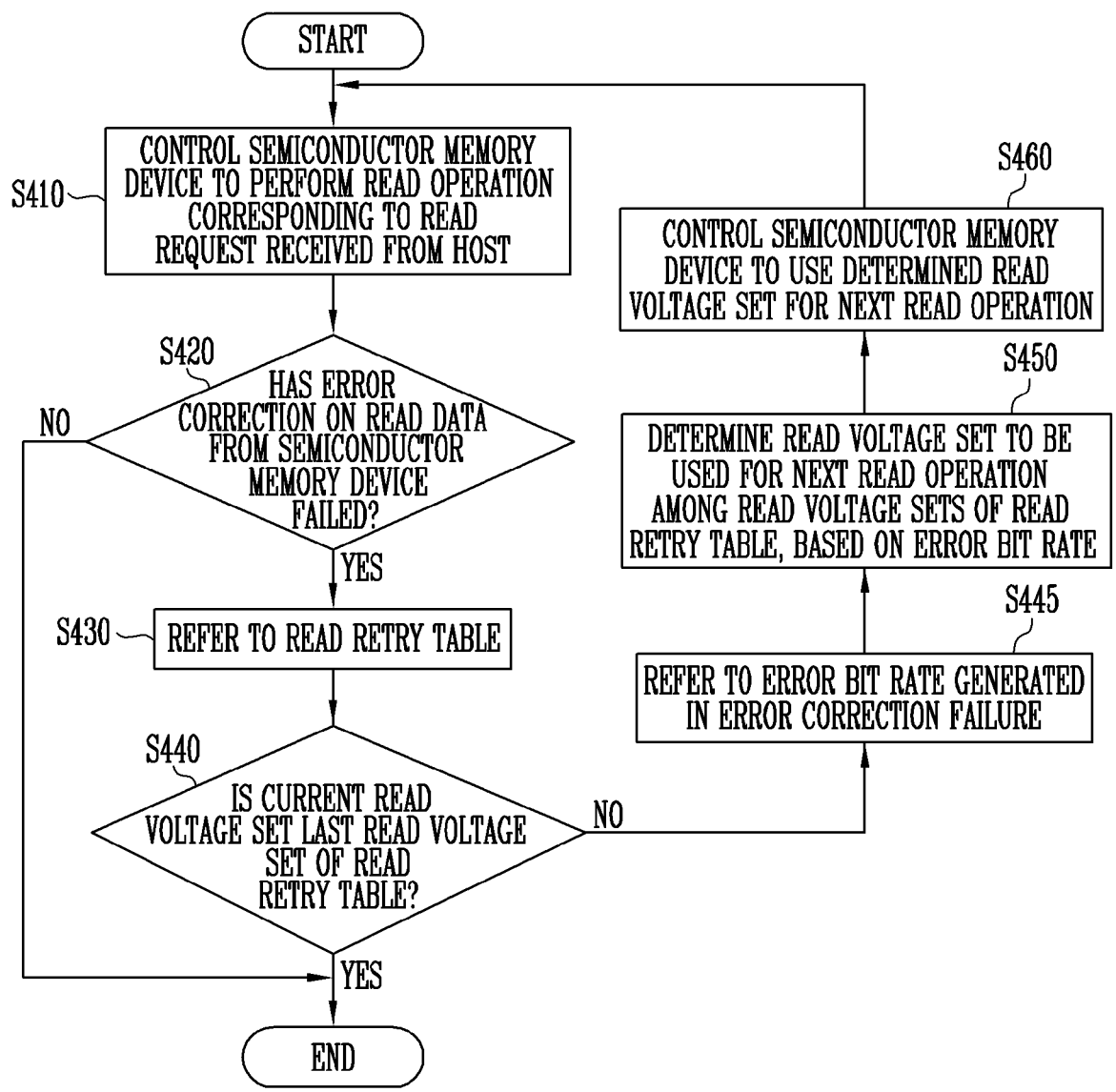
FIG. 21 illustrates an embodiment of a method of operating a controller.

FIG. 21 is a flowchart illustrating an embodiment of an operating method of the controller shown in FIG. 20A, which embodiment includes another exemplary implementation of operation S130 shown in FIG. 7. In this embodiment, operation S130 shown in FIG. 7 includes operations S410, S420, S430, S440, S445, S450, and S460 shown in FIG. 21. Operations S410, S420, S430, S440, and S460 shown in FIG. 21 may be the same as operations S310, S320, S330, S340, and S360 shown in FIG. 12.

After operations S410, S420, and S430 are performed, the controller 202 proceeds to operation S445 when the read voltage set (which is set in the semiconductor memory device 100) is not the last read voltage set among the read voltage sets in the read retry table (e.g., S440, No). In operation S445, the read voltage controller 212 refers to an error bit rate in the error bit rate information Inf_EBR received from the error correction block 232.

Subsequently, in operation S450, the read voltage controller 212 determines a read voltage set to be used for a next read operation (among the read voltage sets in the read retry table RRT) based on the error bit rate. An embodiment of a method for determining a read voltage set in operation S450 is described with reference to FIGS. 22 to 24.

As described with reference to FIG. 21, in one embodiment the controller 202 determines a read voltage set based on an error bit rate in read data. Accordingly, the read voltage set can be adaptively determined based on the error bit rate. As a result, the read speed of memory system 1002 may be improved. In addition, the number of unnecessary read operations by the semiconductor memory device 100 can be reduced.

FIG. 22 is a diagram illustrating an embodiment of a read retry table which may be used in the operating method shown in FIG. 21.

Referring to FIG. 22, similarly to FIG. 13, a read retry table may include n read voltage sets, with each entry in the read retry table including a read voltage set and each read voltage set including three read voltages. For example, an entry of a first row may represent a read voltage set including a first read voltage R1_1, a second read voltage R2_1, and a third read voltage R3_1. An entry of a second row may represent a read voltage set including a first read voltage R1_2, a second read voltage R2_2, and a third read voltage R3_2. An entry of an nth row may represent a read voltage set including a first read voltage R1_n, a second read voltage R2_n, and a third read voltage R3_n.

Each entry of the read retry table shown in FIG. 22 belongs to any one of first to kth read voltage set groups RSG1 to RSGk. For example, the read voltage sets in the read retry table may be grouped into the first to kth read voltage set groups RSG1 to RSGk. In the example shown in FIG. 13, each read voltage set group includes five read voltage sets, e.g., the first read voltage set group RSG1 includes first to fifth read voltage sets. The first read voltage set includes the first to third read voltages R1_1, R2_1, and R3_1. The second read voltage set includes the first to third read voltages R1_2, R2_2, and R3_2. In like manner, the fifth read voltage set includes first to third read voltages R1_5, R2_5, and R3_5. The second read voltage set group RSG2 includes sixth to tenth read voltage sets. However, the present disclosure is not limited thereto, and each read voltage set group may include various numbers of read voltage sets.

In FIG. 22, the read voltage sets are aligned in a predetermined (e.g., ascending) order with respect to an average deviation Δ_avg with a reference voltage set. An example of the average deviation Δ_avg with the reference voltage set is described with reference to FIG. 24.

In one embodiment of the controller 202 and the operating method thereof, a read voltage set to be used for a next read operation is selected based on an error bit rate of a memory block which becomes a target of a read operation. An example embodiment is described with reference to FIGS. 21 to 23 together.

Figure 23:
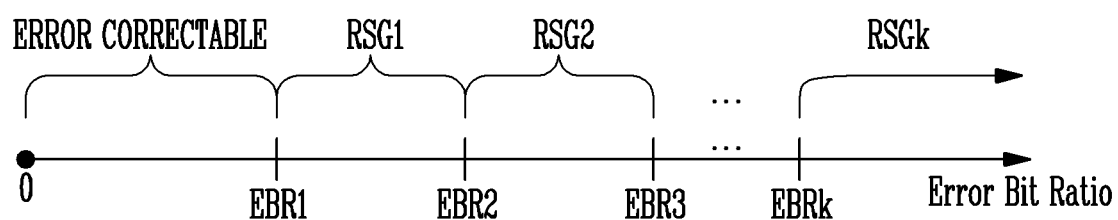
FIG. 23 illustrates an embodiment of selecting a read voltage set group.

FIG. 23 illustrates an embodiment corresponding to the selection of a read voltage set group according to an error bit rate of read data.

Referring to FIG. 23, when the error bit rate of the read data is greater than or equal to 0 and is less than a first error bit rate EBR1, error correction on the read data is possible (e.g., S420, No). Therefore, the read retry operation is not performed.

When the error bit rate of the read data is greater than or equal to the first error bit rate EBR1 and is less than a second error bit rate EBR2, the first read voltage set group RSG1 is selected. Also, when the error bit rate of the read data is greater than or equal to the second error bit rate EBR2 and is less than a third error bit rate EBR3, the second read voltage set group RSG2 is selected. In this manner, when the error bit rate of the read data is greater than or equal to a (k-1)th error bit rate EBR(k-1) and is less than a kth error bit rate EBRk, the (k-1)th read voltage set group RSG(k-1) is selected. Finally, when the error bit rate of the read data is greater than or equal to the kth error bit rate EBRk, the kth read voltage set group RSGk is selected.

Referring to FIGS. 21 to 23 together, at S410, the controller 202 controls the semiconductor memory device 100 to perform a read operation corresponding to a read request received from the host. At S420, a determination is made as to whether error correction on read data from the semiconductor memory device 100 has failed. At S430, when error correction on read data received from the semiconductor memory device 100 has failed (e.g., as a result obtained by performing an initial read operation corresponding to the request (S420, Yes)), the controller 202 refers to a read retry table. At S440, the controller 202 determines whether a current read voltage set is a last read voltage set of the read retry table. When the read operation corresponding to the received read request has been initially performed, the current read voltage set is not the last read voltage set of the read retry table (e.g., S440, No). Accordingly, at S445, the read voltage controller 212 refers to an error bit rate of read data, and, at S450, determines a read voltage set to be used for a next read operation based on the error bit rate.

In operation S450, a read voltage set group is determined according to the method shown in FIG. 23, and a first read voltage set among read voltage sets in the determined read voltage set group is determined as a start point used for a read retry operation.

For example, the controller 202 refers to an error bit rate of received read data as a result of the read operation corresponding to the read request and determines an initial read voltage set to be selected in the read retry operation based on the error bit rate. The controller 202 controls the semiconductor memory device 100 to perform the read operation in response to reception of the read request and determines the initial read voltage set to be selected in the read retry operation based on the error bit rate of the read data received from the semiconductor memory device 100.

In an example, when the error bit rate of read data (corresponding to an initial read operation performed in response to reception of the read request) is greater than or equal to the first error bit rate EBR1 and is less than the second error bit rate EBR2, the first read voltage set group RSG1 is selected. Accordingly, selection of the read voltage set used in the read retry operation is started from the first read voltage set.

In one example, when the error bit rate of the read data corresponding to the initial read operation performed in response to the reception of the read request is greater than or equal to the second error bit rate EBR2 and is less than the third error bit rate EBR3, the second read voltage set group RSG2 is selected. Accordingly, selection of the read voltage set used for the read retry operation is started from the sixth read voltage set. The first to fifth read voltage sets are not selected in the read retry operation. Therefore, when the error correction operation on the read data corresponding to the initial read operation fails, the sixth read voltage set as a first read voltage set in the second read voltage set group RSG2 is determined as a read voltage set to be used for a next read operation. When an error correction operation on received read data fails as a read operation result using the sixth read voltage set, the seventh read voltage set is determined as a read voltage set to be used for a next read operation. In this manner, read voltage sets are sequentially selected from the sixth read voltage set to the nth read voltage set.

Referring to operation S440 shown in FIG. 21, when a current read voltage set is the last read voltage set of the read retry table, the read operation is ended. For example, under a condition in which the error correction failure is continued, the read retry operation may be repeatedly performed until the read voltage set becomes the last read voltage set. In an example, when the error bit rate of the read data is greater than or equal to the second error bit rate EBR2 and is less than third error bit rate EBR3, the read operation may be repeatedly performed (n-5) times from the sixth read voltage set to the nth read voltage set, under a condition in which the error correction operation continuously fails.

In one embodiment, the read retry operation may be performed only in a read voltage set group corresponding to the error bit rate. For example, when the error bit rate of the read data is greater than or equal to the second error bit rate EBR2 and is less than third error bit rate EBR3, the read operation may be repeatedly performed only five times from the sixth read voltage set to the tenth read voltage set under a condition in which the error correction operation continuously fails. Instead of operation S440, whether the read operation is to be ended or whether the controller 202 is to proceed to operation S445 may be determined based on a determination of whether the current read voltage set is a last read voltage set of the read voltage set group corresponding to the error bit rate of the read data.

In an embodiment, the read voltage sets of the read retry table are aligned in a predetermined (e.g., ascending) order with respect to the average deviation $\Delta\_avg$ with the reference voltage set. For example, in the read retry table shown in FIG. 22, an average $\Delta\_2$ between the second read voltage set and the reference voltage set may be greater than that $\Delta\_1$ between the first read voltage set and the reference voltage set. In addition, an average $\Delta\_3$ between the third read voltage set and the reference voltage set may be greater than that $\Delta\_2$ between the second read voltage set and the reference voltage set.

In this manner, the read voltage sets may be aligned such that average deviations $\Delta\_1$ to $\Delta\_n$ between the respective read voltage sets and the reference voltage set are gradually increased. For example, the read voltage sets of the read retry table may be aligned in ascending order with respect to the average deviations $\Delta\_1$ to $\Delta\_n$ with the reference voltage set. Error bit rate of the read data may be considered to be high when the difference between a read voltage set which enables error correction and a reference read voltage used just after initial program is large, e.g., greater than a predetermined value. Therefore, when the error bit rate of the read data is high (e.g., above a predetermined rate), a read voltage set having a large average deviation (e.g., above a predetermined average deviation) with the reference voltage set may be preferentially used for the read retry operation. Accordingly, the read performance of the memory system 1002 can be improved. An example of an average deviation between each read voltage set in the read retry table and the reference voltage set is described with reference to FIG. 24.

Figure 24:
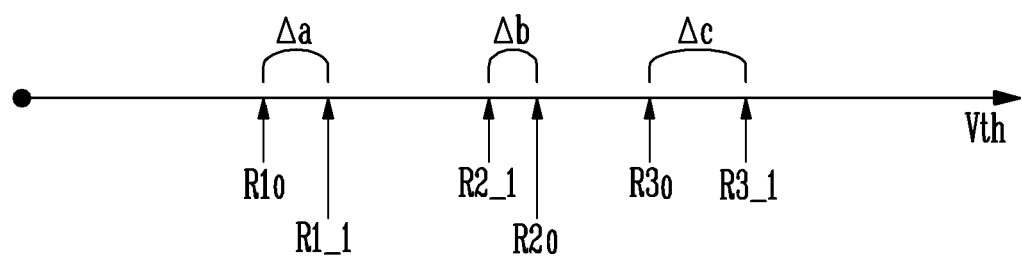
FIG. 24 illustrates an example of an average deviation between a first read voltage set and a reference voltage set.

FIG. 24 is a graph illustrating an example of the average deviation between the first read voltage set and the reference voltage set. In FIG. 24, the first read voltage $R1\_1$, the second read voltage $R2\_1$, and the third read voltage $R3\_1$ are illustrated and are in the first read voltage set of the read retry table. A first read voltage $R1_0$, second read voltage $R2_0$, and third read voltage $R3_0$ are also illustrated and are in the reference voltage set.

The first read voltage $R1_0$, the second read voltage $R2_0$, and the third read voltage $R3_0$ in the reference voltage set may be the first to third read voltages $R1_0$ to $R3_0$ shown in FIG. 9A. For example, the reference voltage set may correspond to a read voltage set used in a state before degradation of a threshold voltage distribution occurs just after a program operation is completed.

The average deviation $\Delta\_1$ between the first read voltage set and the reference voltage set may be determined as an average value of a difference $\Delta a$ between the first read voltage $R1\_1$ and the first read voltage $R1_0$, a difference $\Delta b$ between the second read voltage $R2\_1$ and the second read voltage $R2_0$, and a difference $\Delta c$ between the third read voltage $R3\_1$ and the third read voltage $R3_0$. For example, the average deviation $\Delta\_1$ between the first read voltage set and the reference voltage set may be determined as by Equation 5.

$$\Delta\_1 = \frac{|R1\_1 - R1_0| + |R2\_1 - R2_0| + |R3\_1 - R3_0|}{3} \quad (5)$$

When this is generally expressed, an average deviation $\Delta\_i$ between an ith read voltage set and the reference voltage set may be determined by Equation 6.

$$\Delta\_i = \frac{|R1\_i - R1_0| + |R2\_i - R2_0| + |R3\_i - R3_0|}{3} \quad (6)$$

In one embodiment, the average deviation $\Delta\_i$ between the ith read voltage set and the reference voltage set may be determined by Equation 7.

$$\Delta\_i = \sqrt{\frac{(R1\_i - R1\_0)^2 + (R2\_i - R2\_0)^2 + (R3\_i - R3\_0)^2}{3}} \quad (7)$$

In other embodiments, the average deviation $\Delta\_i$ between the ith read voltage set and the reference voltage set may be determined in ways different from Equations 6 and 7.

As described above, the read voltage sets in the read retry table shown in FIG. 22 may be aligned such that the average deviation between the read voltage set and the reference voltage set increases as consecutive numbers of the read voltage sets increase.

When the read voltage sets of the read retry table stored in the read retry table storage 252 are not aligned according to the above-described reference, one embodiment of the operating method of the controller may include an operation of preferentially aligning the read voltage sets of the read retry table as described above. An embodiment will be described with reference to FIG. 25.

Figure 25:
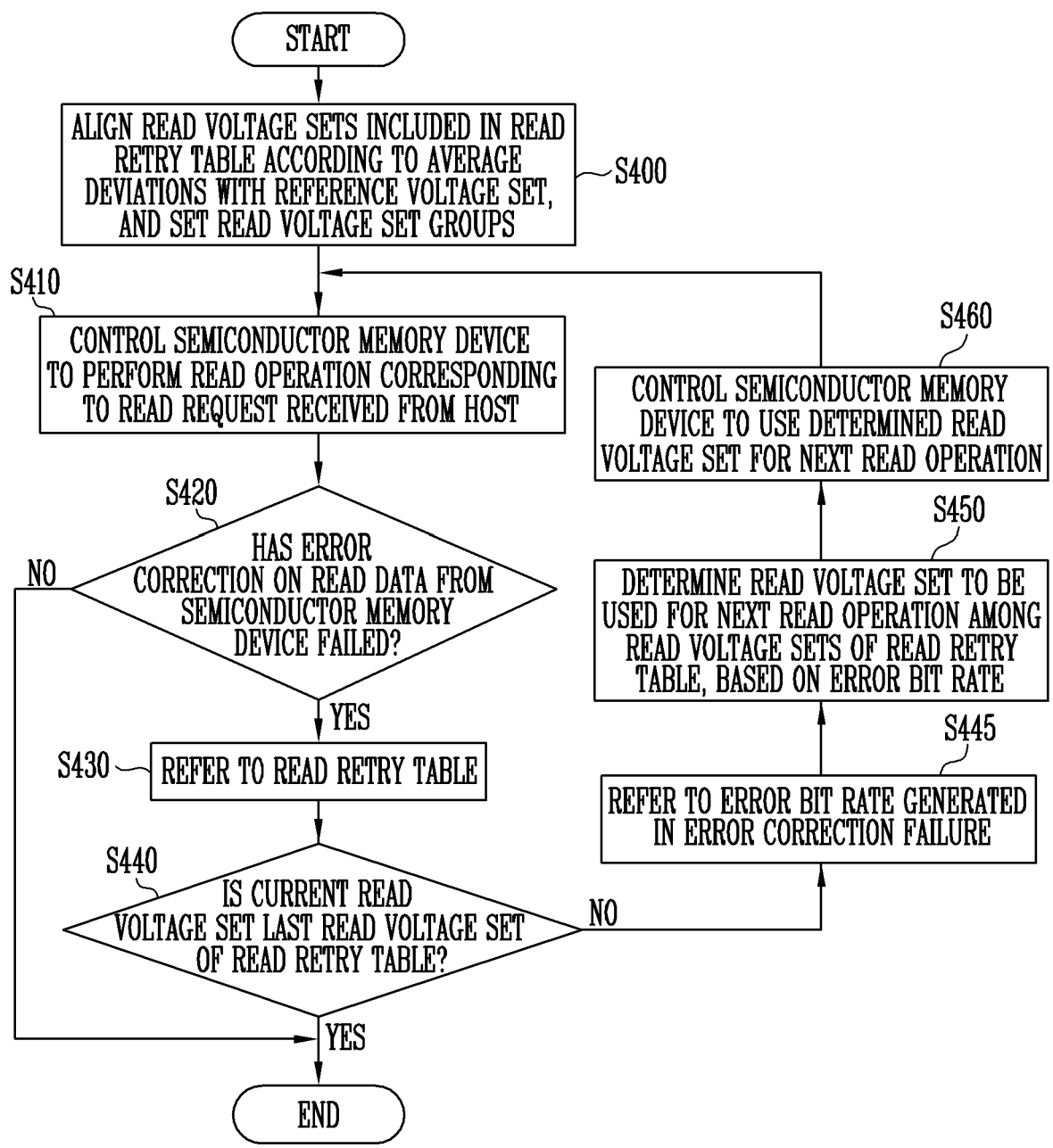
FIG. 25 illustrates an embodiment of a method of operating a controller.

FIG. 25 is a flowchart illustrating an embodiment of an operating method of the controller shown in FIG. 20A. This method may be the same as the method of FIG. 21, except that the method of FIG. 25 further includes operation S400. For example, the operating method of FIG. 25 may include operations S410, S420, S430, S440, S445, S450, and S460 shown in FIG. 21 as they are.

In operation S400, the controller 202 calculates average deviations $\Delta\_1$ to $\Delta\_n$ with reference voltage set with respect to the respective read voltage sets in the read retry table. Subsequently, the read voltage sets may be aligned according to magnitudes of the calculated average deviations $\Delta\_1$ to $\Delta\_n$, and read voltage set groups may be set with respect to the aligned read voltage sets. As described above, when the read voltage sets in the read retry table are not aligned with respect to an average deviation $\Delta\_avg$, the controller 202 may align the read voltage sets and then set read voltage set groups through operation S400. In operation S400, read voltage sets which are not aligned may be aligned in a predetermined (e.g., ascending) order with respect to the average deviation $\Delta\_avg$ with the reference voltage set. Accordingly, the read voltage sets of the read retry table may be aligned as shown in FIG. 22, e.g., the read voltage sets are aligned such that the average deviations $\Delta\_1$ to $\Delta\_n$ with the reference voltage set gradually increase.

Subsequently, read voltage set groups RSG1 to RSGk are set with respect to the aligned read voltage sets. Accordingly, five read voltage sets having lowest average deviations $\Delta\_1$ to $\Delta\_5$ are in a first read voltage set group RSG1. Five read voltage sets having lowest average deviations $\Delta\_6$ to $\Delta\_10$ among the other read voltage sets except the read voltage sets in the first read voltage set group RSG1 are in a second read voltage set group RSG2. In this manner, in operation S400, the controller 202 may generate a read retry table in which the read voltage sets are aligned with respect to the average deviation $\Delta\_avg$. The generated read retry table is stored in the read retry table storage 252. Operations continued after S400 may be the same as those described with reference to FIG. 16.

Figure 26:
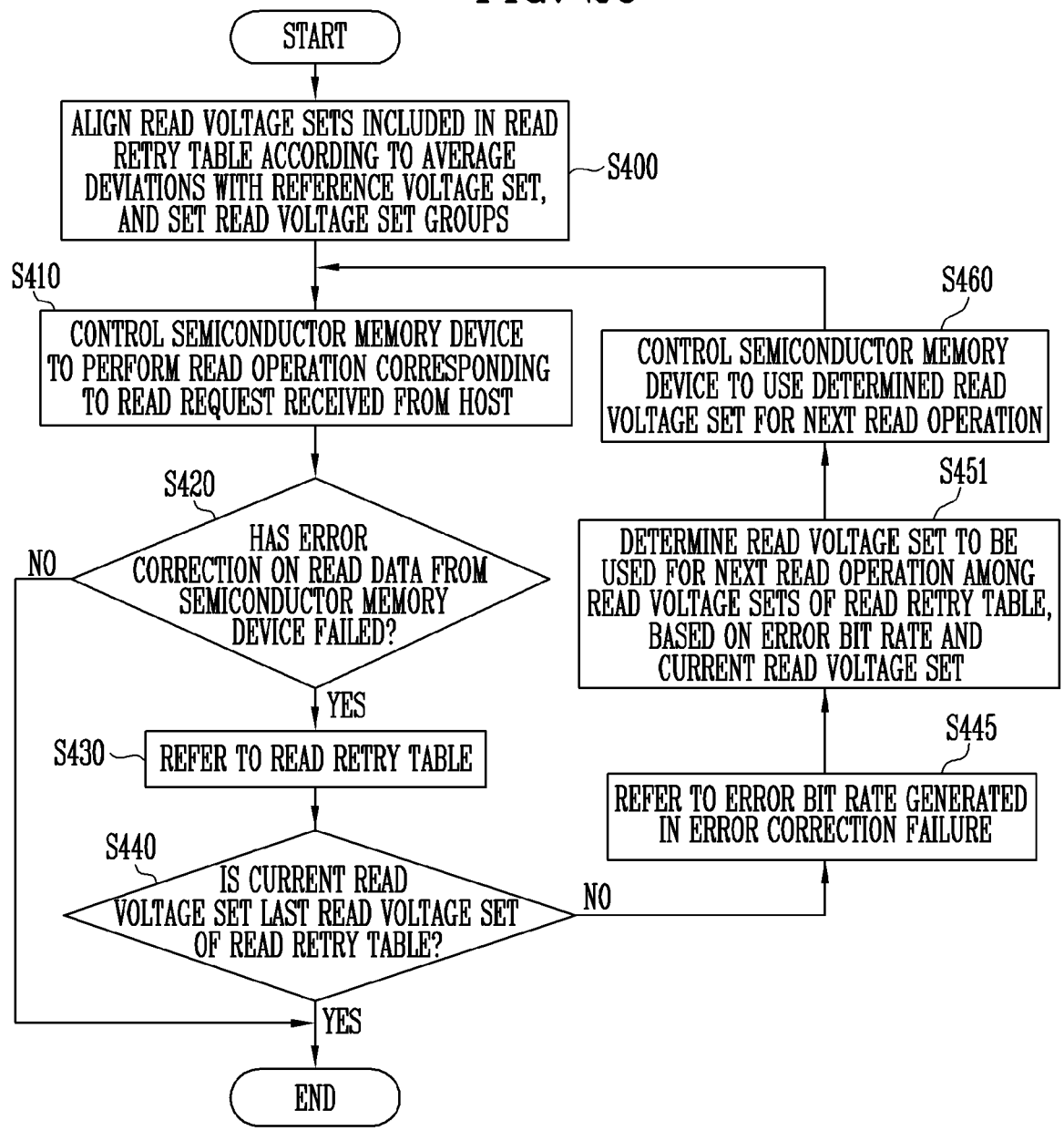
FIG. 26 illustrates an embodiment of a method of operating a controller.

FIG. 26 is a flowchart illustrating an embodiment of an operating method of controller 202 shown in FIG. 20A. This method may be the same as the method of FIG. 25, except that operation S451 is performed instead of operation S450.

In operation S451, the controller 202 determines a read voltage set to be used for a next read operation, among the read voltage sets of the read retry table, based on an error bit rate and a current read voltage set. In operation S451, the controller 202 may determine a read voltage set to be used for a next read operation based on whether the error bit rate exceeds a predetermined reference value. An embodiment will be described with reference to FIG. 27.

Figure 27:
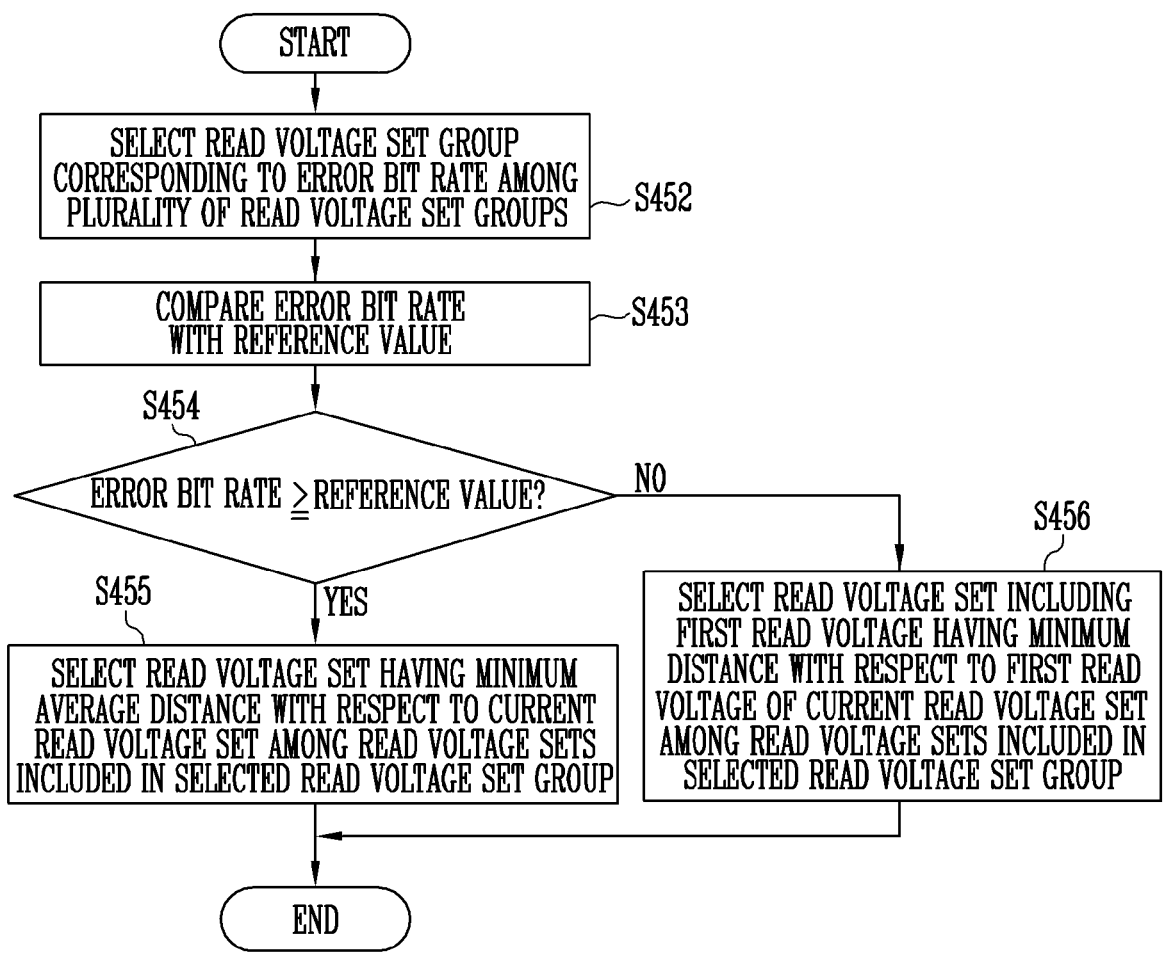
FIG. 27 illustrates an embodiment of an operation in FIG. 26.

FIG. 27 is a diagram illustrating an embodiment of operation S451 shown in FIG. 26. Referring to FIG. 27, in order to perform operation S451 shown in FIG. 26, first, at S452, the controller 202 selects a read voltage set group corresponding to the error bit rate among a plurality of read voltage set groups. In this process, the read voltage group set may be selected in the same manner as described with reference to FIGS. 22 and 23. For example, when the error bit rate of read data is greater than or equal to the second error bit rate EBR2 and is less than the third error bit rate EBR3, the second read voltage set group RSG2 is selected.

Subsequently, at S453, the controller 202 compares the error bit rate with the predetermined reference value. Subsequently, at S454, the controller 202 determines whether error bit rate is greater than or equal to the reference value. At S455, when the error bit rate is greater than or equal to the reference value (S454, Yes), the controller 202 selects a read voltage set having a minimum average distance with respect to the current read voltage set among read voltage sets in the read voltage set group selected in operation S452. At S456, when the error bit rate is less than the reference value (S454, No), the controller 202 selects a read voltage set including a first read voltage having a minimum distance with respect to a first read voltage of the current read voltage set among the read voltage sets in the read voltage set group selected in operation S452.

In one embodiment, operation S455 may be performed in the same manner as operation S355 in FIG. 18, e.g., operation S455 may be performed in the same manner as described with reference to FIG. 19A. Operation S456 may be performed in the same manner as operation S356 in FIG. 18, e.g., operation S456 may be performed in the same manner as described with reference to FIG. 19B.

Figure 28A:
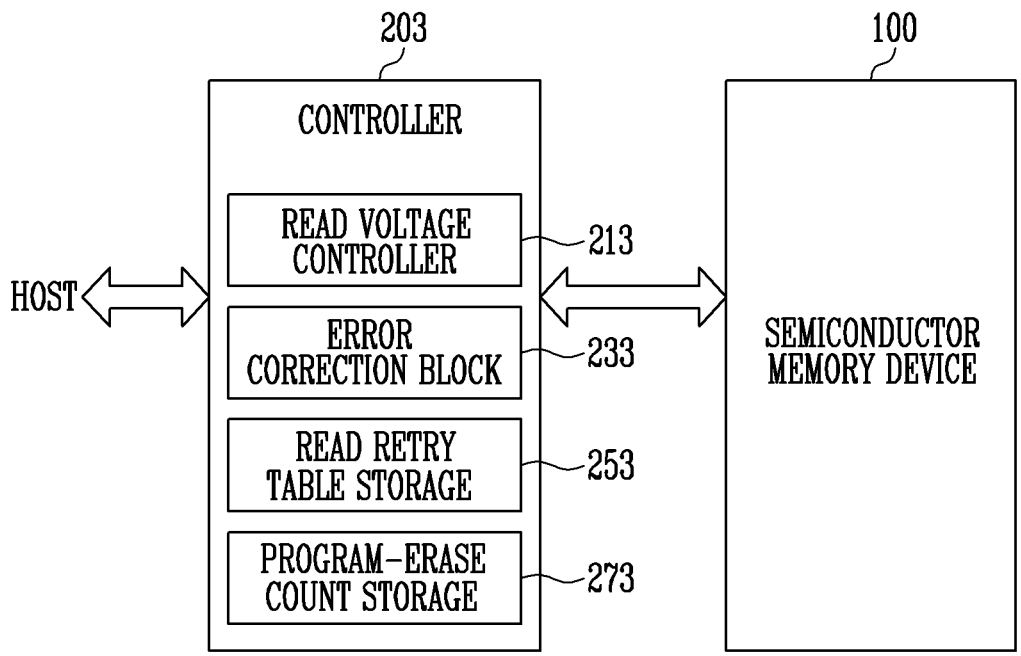
FIG. 28A illustrates an embodiment of a memory system including a controller.
Figure 28B:
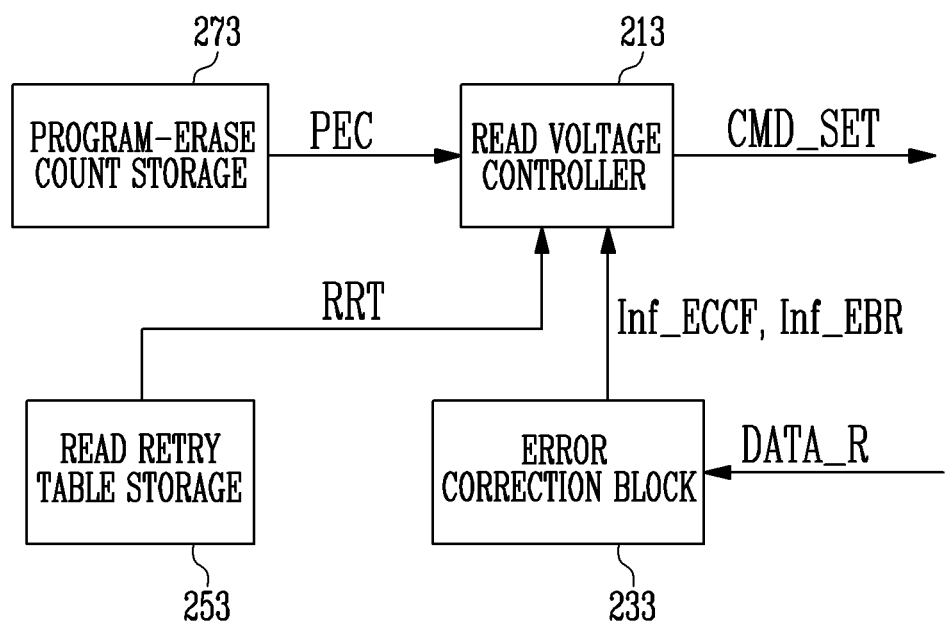
FIG. 28B illustrates an embodiment of operation of features in the controller shown in FIG. 28A.

FIG. 28A is a block diagram illustrating an embodiment of a memory system 1003 including a controller 203, and FIG. 28B is a block diagram illustrating an embodiment of operation of features in the controller 203 shown in FIG. 28A.

Referring to FIG. 28A, the memory system 1003 includes a semiconductor memory device 100 and the controller 203. The semiconductor memory device 100 may be the semiconductor memory device shown in FIG. 2.

The controller 203 includes a read voltage controller 213, an error correction block 233, a read retry table (RRT) storage 253, and a program-erase count storage 273. The read voltage controller 213, the error correction block 233, and the read retry table storage 253 of FIG. 28A may be, for example, the same as the read voltage controller 210, 211 or 212, the error correction block 230, 231 or 232, and the read retry table (RRT) storage 250, 251 or 252 described with reference to FIG. 1, 11A or 20A. The program-erase count storage 273 shown in FIG. 28A may be the same as the program-erase count storage 271 as in FIG. 11A.

Referring to FIG. 28B, the program-erase count storage 273 may provide the read voltage controller 213 with a program-erase count value PEC of a memory block in which data to be read is stored. The read retry table storage 253 may transfer a read retry table RRT including a plurality of read voltage sets to the read voltage controller 213. The error correction block 233 may perform an error correction operation on read data DATA_R received from the semiconductor memory device 100. When the error correction operation on the read data DATA_R fails, the error correction block 233 transfers error correction failure information Inf_ECCF and error bit rate information Inf_EBR to the read voltage controller 213. The error bit rate information Inf_EBR may be information representing a rate of error bits in the read data DATA_R.

In an example, the error correction block 233 may perform the error correction operation through a Low Density Parity Check (LDPC) code. A syndrome weight may be generated in a process in which the error correction block 233 decodes a codeword through the LDPC code. The error bit rate information Inf_EBR may include an error bit rate predicted from the syndrome weight. However, this is merely an example, and the error bit rate of the codeword may be calculated or estimated using different error correction methods in other embodiments.

The error correction block 233 may generate error bit rate information Inf_EBR quantitatively representing the error bit rate calculated or estimated described above, and may transfer the generated error bit rate information Inf_EBR to the read voltage controller 213.

The read voltage controller 213 changes a read voltage set of the semiconductor memory device 100 in response to the error correction failure information Inf_ECCF. For example, the read voltage controller 213 generates a set-parameter command CMD_SET for changing the read voltage set. The generated set-parameter command CMD_SET is transferred to the semiconductor memory device 100. The semiconductor memory device 100 changes a read voltage set used for a read operation in response to the set-parameter command CMD_SET. Subsequently, the controller 203 may transfer a read command to the semiconductor memory device 100, and the semiconductor memory device 100 may re-perform the read operation in response to the received read command.

In accordance with one embodiment of the controller 203, the read voltage controller 213 may determine a read voltage set to be used for the read operation of the semiconductor memory device 100 (among a plurality of read voltage sets in the read retry table RRT) based on the program-erase count value PEC and the error bit rate information Inf_EBR.

Figure 29:
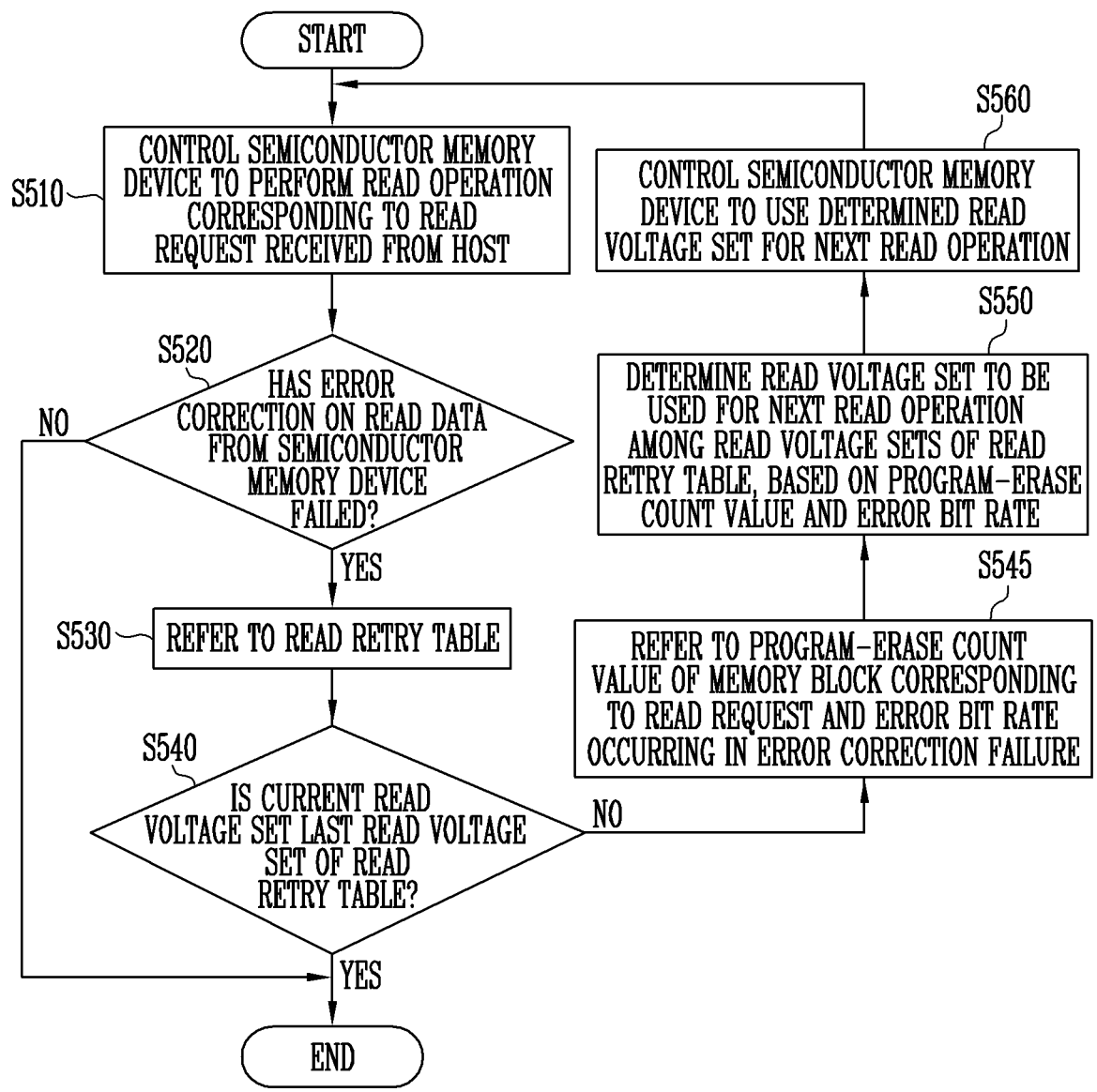
FIG. 29 illustrates an embodiment of a method of operating a controller.

FIG. 29 is a flowchart illustrating an embodiment of an operating method of controller 203 shown in FIG. 28A, including an example implementation of operation S130 shown in FIG. 7. Here, operation S130 may include operations S510, S520, S530, S540, S545, S550, and S560. Operations S510, S520, S530, S540, and S560 may be the same as operations S410, S420, S430, S440, and S460 shown in FIG. 21.

After operations S510, S520, and S530 are performed, the controller 203 proceeds to operation S545 when the read voltage set which is set in the semiconductor memory device 100 is not the last read voltage set, among the read voltage sets in the read retry table (S540, No). At S545, the read voltage controller 213 refers to a program-erase count value PEC and an error bit rate in the error bit rate information Inf_EBR received from the error correction block 233. At S550, the read voltage controller 213 determines a read voltage set to be used for a next read operation, among the read voltage sets in the read retry table RRT, based on the program-erase count value PEC and the error bit rate.

Figure 30:
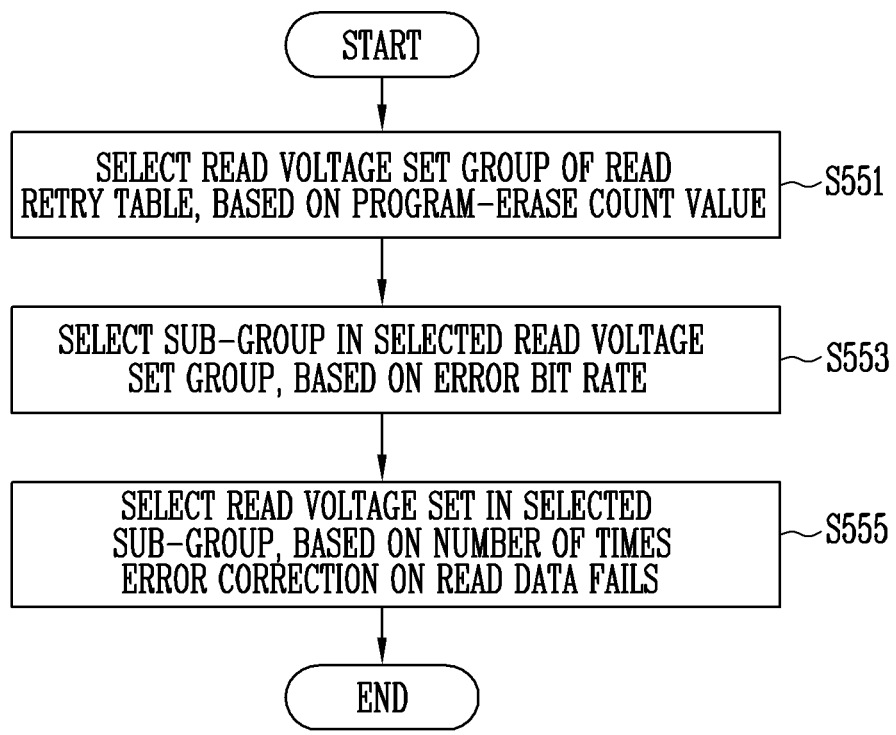
FIG. 30 illustrates an embodiment of an operation in FIG. 29.
Figure 31:
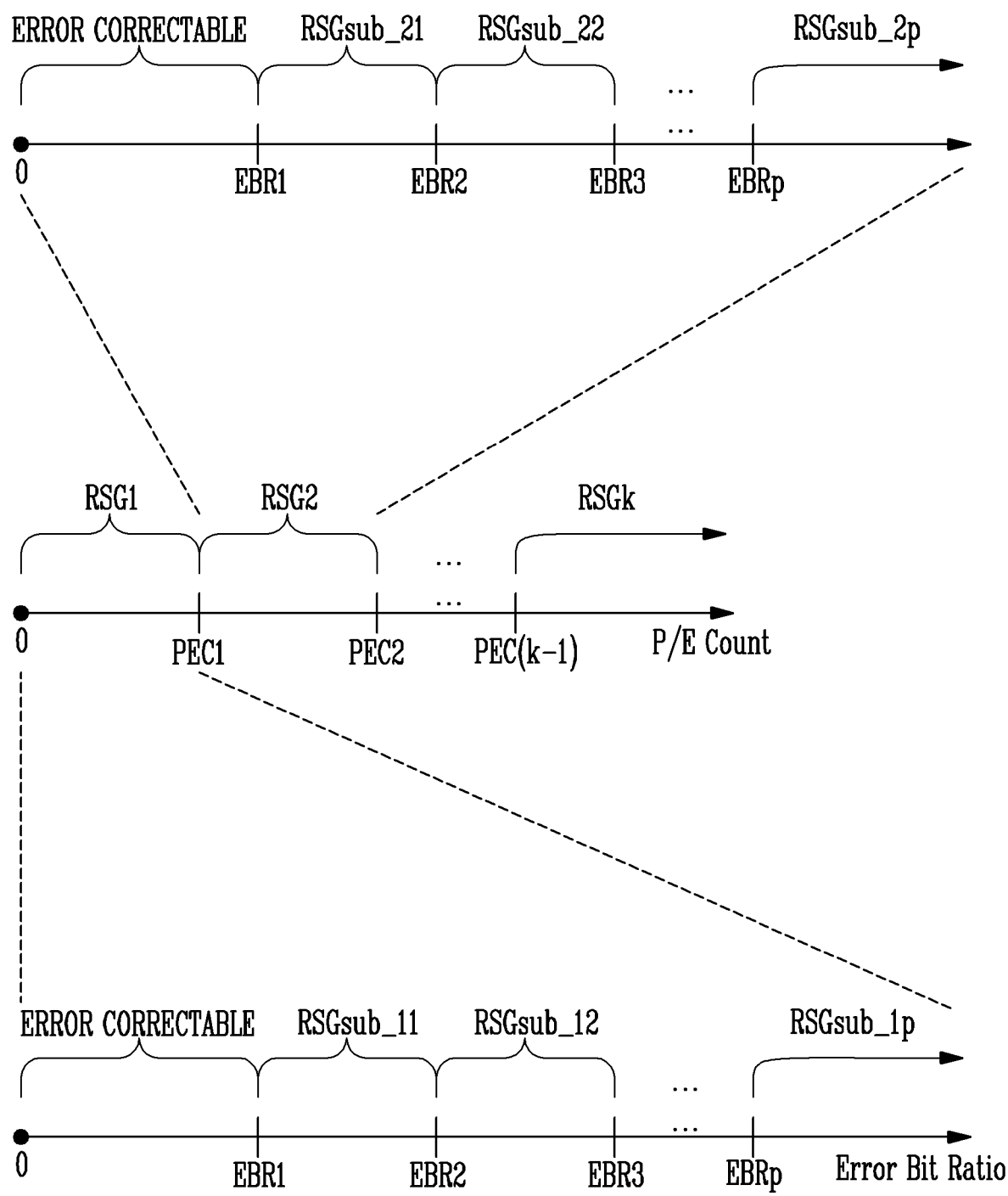
FIG. 31 illustrates an example of a relationship between a read voltage set group and a sub-group.

FIG. 30 is a flowchart illustrating an embodiment of operation S550 shown in FIG. 29, FIG. 31 is a graph illustrating an example of a relationship between a read voltage set group selected according to operation S551 and a sub-group selected according to operation S553, and FIG. 32 is a diagram illustrating an example of a read retry table. Hereinafter, operation S550 in FIG. 29 is described with reference to FIGS. 30 to 32 together.

Referring to FIG. 30, operation S550 includes operation S551 of selecting a read voltage set group of the read retry table based on a program-erase count value of a memory block as a read target, operation S553 of selecting a sub-group in the selected read voltage set group based on an error bit rate of read data, and operation S555 of selecting a read voltage set in the selected sub-group based on a number of times error correction on the read data fails.

In operation S551, first, the controller 203 select a read voltage set group of the read retry table based on a program-erase count value of a memory block. Referring to FIG. 31, when the program-erase count value of the memory bock is greater than or equal to 0 and is less than the first program-erase count PEC1, the first read voltage set group RSG1 is selected. Also, when the program-erase count value of the memory block is greater than or equal to the first program-erase count PEC1 and is less than the second program-erase count PEC2, the second read voltage set group RSG2 is selected. In this manner, when the program-erase count value of the memory block is greater than or equal to the (k-2)th program-erase count PEC(k-2) and is less than the (k-1)th program-erase count PEC(k-1), the (k-1)th read voltage set group RSG(k-1) is selected. Finally, when the program-erase count value of the memory block is greater than or equal to the (k-1)th program-erase count PEC(k-1), the kth read voltage set group RSGk is selected. Operation S551 of selecting the read voltage set group based on the program-erase count value may be performed in a manner similar to the method for selecting the read voltage set group, which is described with reference to FIG. 14.

After the read voltage set group is selected, a sub-group in the selected read voltage set group is selected based on an error bit rate of read data. Referring to FIG. 32, the read retry table incudes n read voltage sets. Each of the n read voltage sets belongs to any one of first to kth read voltage set groups RSG1 to RSGk.

The first to kth read voltage set groups RSG1 to RSGk include a plurality of sub-groups. In FIG. 32, each read voltage set group may include a predetermined number of sub-groups, e.g., three sub-groups. For example, the first read voltage set group RSG1 may include three sub-groups RSGsub_11 to RSGsub_13, and the second read voltage set group RSG2 may include three sub-groups RSGsub_21 to RSGsub_23.

Each sub-group includes a plurality of read voltage sets. In the example shown in FIG. 32, each sub-group includes five read voltage sets, namely sub-group RSGsub_11 includes first to fifth read voltage sets, sub-group RSGsub_12 incudes sixth to tenth read voltage set, and sub-group RSGsub_13 includes eleventh to fifteenth read voltage sets. Thus, in the example shown in FIG. 32, the sub-group includes five read voltage sets and the read voltage set group includes three sub-groups. As a result, the read voltage set group includes a total of 15 read voltage sets.

In accordance with one embodiment, at S551, a read voltage set group is selected based on the program-erase count value of the memory block. At S553, a sub-group in the selected read voltage set group is selected based on the error bit rate of the read data. Subsequently, at S555, read voltage sets in the selected sub-group are sequentially selected, and a read retry operation is performed using the selected read voltage sets.

In the example shown in FIG. 31, when the program-erase count value of a memory block corresponding to the read request is greater than or equal to the first program-erase count PEC1 and is less than the second program-erase count PEC2, the second read voltage set group RSG2 is selected. In this situation, when the error bit rate of read data is greater than or equal to the first error bit rate EBR1 and is less than the second error bit rate EBR2, the sub-group RSGsub_21 is selected. Accordingly, read voltage sets may be used from a sixteenth read voltage set in the read retry operation.

In one example, when the program-erase count value of a memory block corresponding to the read request is greater than or equal to 0 and is less than the first program-erase count PEC1, the first read voltage set group RSG1 is selected. In this situation, when the error bit rate of read data is greater than or equal to the second error bit rate EBR2 and is less than the third error bit rate EBR3, the sub-group RSGsub_12 is selected. Accordingly, read voltage sets may be used from the sixth read voltage set in the read retry operation.

In an embodiment, in the read retry table shown in FIG. 32, the read voltage sets of the read retry table may be aligned in a state in which values of first read voltages R1 sequentially increase. In one embodiment, in the read retry table shown in FIG. 32, the read voltage sets of the read retry table may be aligned such that average deviations $\Delta\_1$ to $\Delta\_n$ between the respective read voltage sets and the reference voltage set gradually increase, e.g., increase at a predetermined rate that is less that a reference value.

When the read voltage sets of the read retry table stored in the read retry table storage 253 are not aligned according to the above-described reference, in accordance with the embodiment the operating method may further include an operation of preferentially aligning the read voltage sets of the read retry table, as described above.

Figure 33:
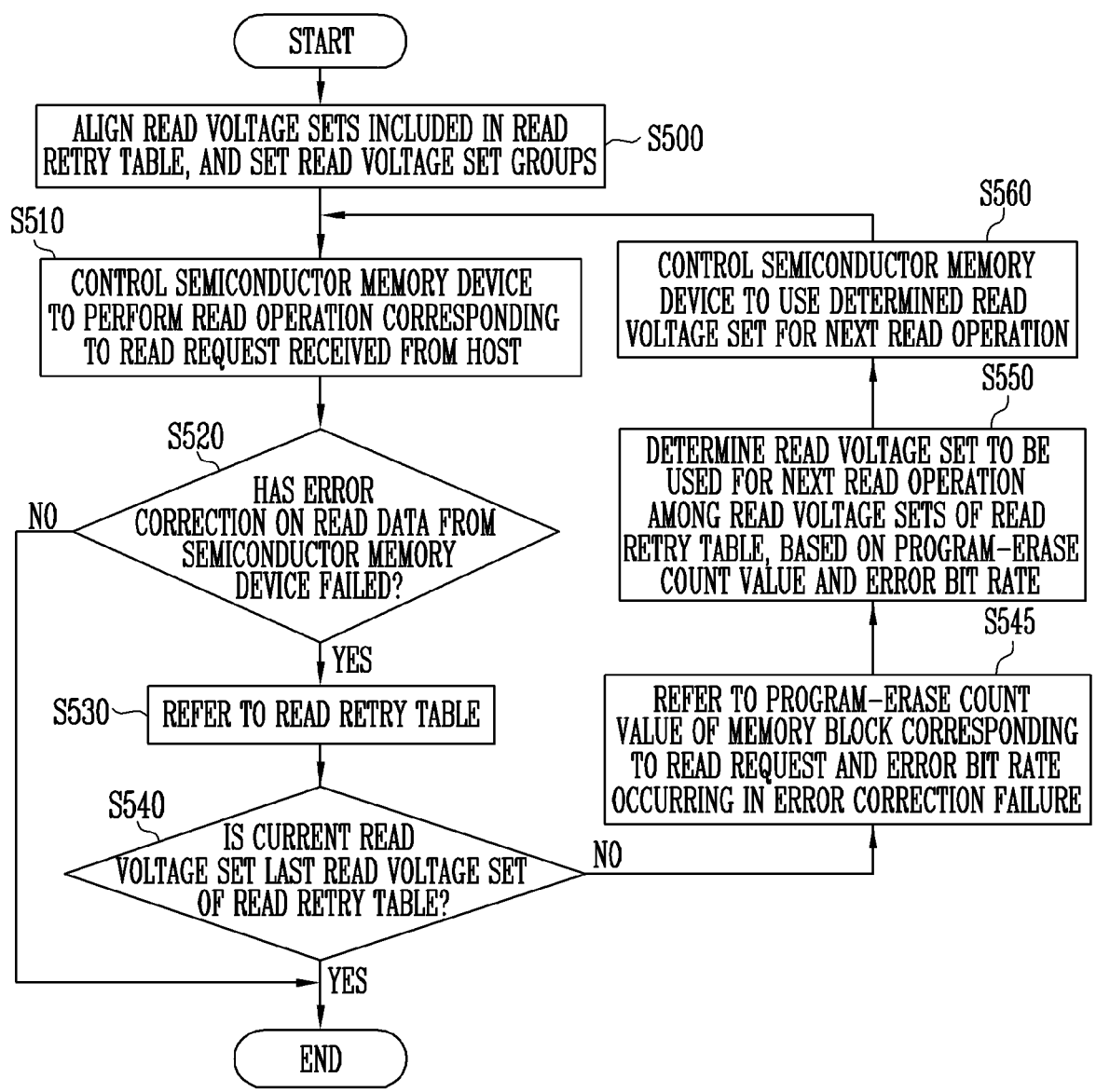
FIG. 33 illustrates an embodiment of a method of operating a controller.

FIG. 33 is a flowchart illustrating an embodiment of an operating method of controller 203 shown in FIG. 28A. This method may be the same as the method of FIG. 29, except that the method shown in FIG. 33 further includes operation S500. The operating method of FIG. 33 may include operations S510, S520, S530, S540, S545, S550, and S560 shown in FIG. 29 as they are.

In operation S500, the controller 203 may align read voltage sets included in the read retry table according to magnitudes of first read voltages R1, and may set read voltage set groups with respect to the aligned read voltage sets. The controller 203 may align the read voltage sets and set the read voltage set groups in the same manner as operation S300 shown in FIG. 16. Accordingly, the read voltage sets of the read retry table are aligned such that the first read voltages R1_1 to R1_n have values which gradually increase, e.g., increase at a predetermined rate below a reference value.

In one embodiment, in operation S500 the controller 203 may calculate average deviations $\Delta\_1$ to $\Delta\_n$ with the reference voltage set with respect to the respective read voltage sets in the read retry table, align the read voltage sets according to magnitudes of the calculated average deviations $\Delta\_1$ to $\Delta\_n$, and set read voltage set groups with respect to the aligned read voltage sets. The controller 203 may align the read voltage sets and set the read voltage set groups in the same manner as operation S400 shown in FIG. 25. Accordingly, the read voltage sets are aligned such that the average deviations $\Delta\_1$ to $\Delta\_n$ with the reference voltage set gradually increase.

In accordance with one embodiment, in operation S500 the controller 203 may align read voltage sets based on magnitudes of first read voltages R1 and average deviations $\Delta\_avg$ with the reference voltage set. An embodiment of a method for aligning read voltage sets by considering both the magnitudes of first read voltages R1 and the average deviations $\Delta\_avg$ with the reference voltage set is described with reference to FIG. 34.

Figure 34:
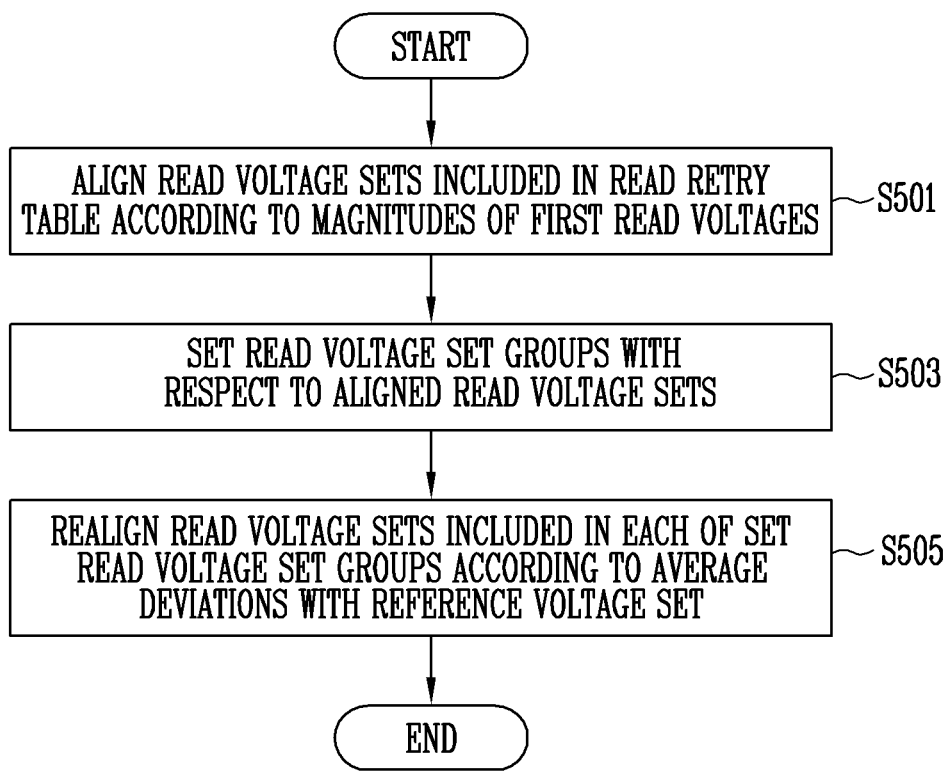
FIG. 34 illustrates an embodiment of an operation in FIG. 33.

FIG. 34 is a flowchart illustrating an embodiment of operation S500 shown in FIG. 33. Referring to FIG. 34, operation S500 includes operation S501 of aligning read voltage sets included in the read retry table according to magnitudes of first read voltages, operation S503 of setting read voltage set groups with respect to the aligned read voltage sets, and operation S505 of realigning read voltage sets included in each of the set read voltage set groups according to average deviations with the reference voltage set.

At S501, the controller 203 may align a plurality of read voltage sets in the read retry table in an ascending order based on first read voltages of the plurality of read voltage sets. For example, in operation S501, the controller 203 may align the read voltage set in the same manner as the operation S300 shown in FIG. 16. As a result obtained by performing operation S501, the read voltage set in the read retry table are aligned such that the first read voltages R1_1 to R1_n have values which gradually increase, e.g., increase at a predetermined rate below a reference value.

At S503, the aligned read voltage sets may be grouped into a plurality of read voltage set groups. For example, 15 read voltage sets having a lowest first read voltage R1 is in the first read voltage set group RSG1. The 15 read voltage sets having a lowest first read voltage R1 (among the other read voltage sets except the read voltage sets in the first read voltage set RSG1) are in the second read voltage set group RSG2. In this manner, in operation S503 the controller 203 may set read voltage set groups with respect to the read voltage sets of the read retry table, which are aligned with respect to the first read voltages.

At S505, the controller 203 realigns read voltage sets in each of the read voltage set groups with respect to average deviations Δ_avg with the reference voltage set. For example, the 15 read voltage sets in the first read voltage set group RSG1 are aligned in a predetermined (e.g., ascending) order with respect to the first read voltage R1 before operation S505 is performed. In S505, the controller 203 realigns the 15 read voltage sets in the first read voltage set group RSG1 with respect to average deviations Δ_avg with the reference voltage set.

Accordingly, after operation S505 is performed, the read voltage sets of the first read voltage set group RSG1 may be realigned with respect to the average deviations Δ_avg with the reference voltage set. Similarly, after operation S505 is performed, the read voltage sets of the second read voltage set group RSG2 may be realigned with respect to the average deviations Δ_avg with the reference voltage set.

A difference between operations S501 and S505 may be follows. Operation S501 is performed using the entire read retry table as a unit before the read voltage set groups are set. On the other hand, operation S505 is performed using each read voltage set group as a unit after the read voltage set groups are set. As a result of these operations, read voltage sets in each read voltage set group may be aligned with respect to the average deviations Δ_avg with the reference voltage set.

Since operations S501 and S503 are performed before operation S505 is performed, a first read voltage having a largest value among the read voltage sets in the first read voltage set group is less than that having a smallest value among the read voltage sets in the second read voltage set group. Similarly, a first read voltage having a largest value among the read voltage sets in the second read voltage set group is less than that having a smallest value among the read voltage sets in the third read voltage set group.

Referring to FIGS. 7 to 34, the present disclosure has been described based on a multi-level cell (MLC) storing 2-bit data. However, the present disclosure is not limited thereto and may be equally applied to a triple-level cell (TLC) storing 3-bit data, a quad-level cell (TLC) storing 4-bit data, and a memory cell storing 5-or-more-bit data.

Figure 35:
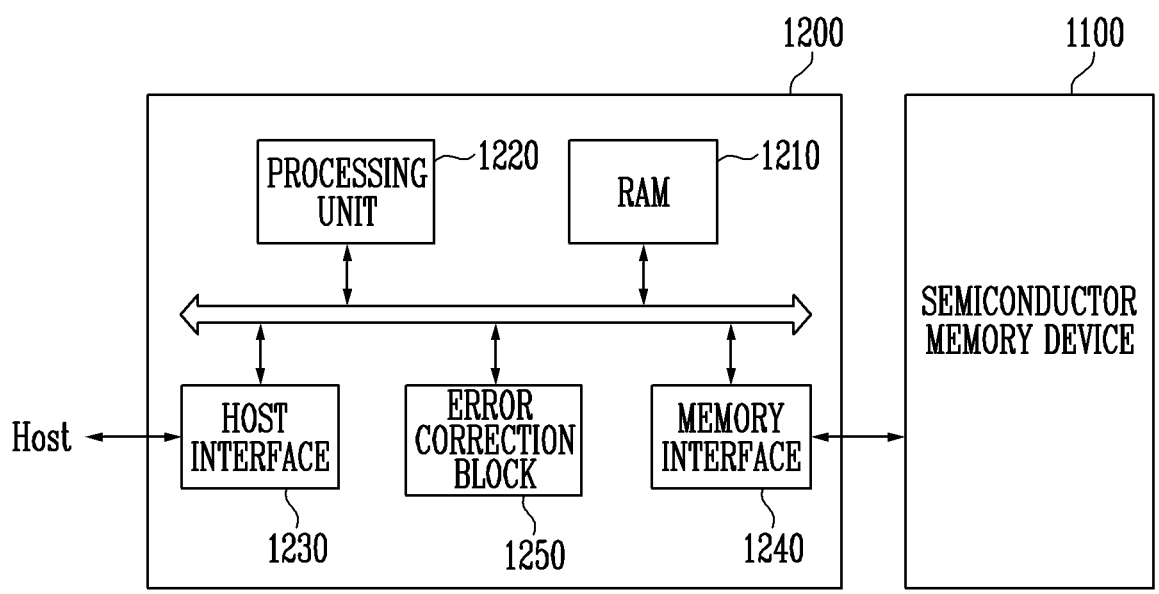
FIG. 35 illustrates an embodiment of a memory system including a controller.

FIG. 35 is a block diagram illustrating an embodiment of a memory system 1005 including the controller shown in FIG. 1, 11A, 20A, or 28A.

Referring to FIG. 35, the memory system 1005 includes a semiconductor memory device 1100 and a controller 1200. The semiconductor memory device 1100 may be the semiconductor memory device described with reference to FIG. 2.

The controller 1200 is connected to a Host and the semiconductor memory device 1100 and accesses the semiconductor memory device 1100 in response to a request from the Host. For example, the controller 1200 controls read, write, erase, and background operations of the semiconductor memory device 1100. The controller 1200 serves as an interface between the semiconductor memory device 1100 and the Host. The controller 1200 execute instructions (e.g., drives firmware) for controlling the semiconductor memory device 1100. The controller 1200 may be the controller 200, 201, 202, or 203 described with reference to FIG. 1, 11A, 20A or 28A.

The controller 1200 includes a random access memory (RAM) 1210, a processing unit 1220, a host interface 1230, a memory interface 1240, and an error correction block 250. The RAM 1210 is used as any one of a working memory of the processing unit 1220, a cache memory between the semiconductor memory device 1100 and the Host, and a buffer memory between the semiconductor memory device 1100 and the Host. The processing unit 1220 controls overall operations of the controller 1200. Also, the controller 1200 may temporarily store program data provided from the Host in a write operation. In some embodiments, the RAM 1210 may be configured as the read retry table storage 250, 251, 252, or 253 shown in FIG. 1, 11A, 20A, or 28A. Also, the RAM 1210 may be configured as the program-erase count storage 271 or 273 shown in FIG. 11A or 28A.

The host interface 1230 includes a protocol for exchanging data between the Host and the controller 1200. In an exemplary embodiment, the controller 1200 communicates with the Host through at least one of various interface protocols. Examples include a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA protocol, a Parallel-ATA protocol, a Small Computer System Interface (SCSI) protocol, an Enhanced Small Disk Interface (ESDI) protocol, an Integrated Drive Electronics (IDE) protocol, and a private protocol.

The memory interface 1240 interfaces with the semiconductor memory device 1100. For example, the memory interface 1240 may include a NAND interface or a NOR interface. In some embodiments, the memory interface 1240 may be configured as the read voltage controller 210, 211, 212 or 213 shown in FIG. 1, 11A, 20A or 28A.

The error correction block 1250 is configured to detect and correct an error of data received from the semiconductor memory device 1100 by using an error correction code (ECC). The processing unit 1220 may control the semiconductor memory device 1100 to adjust a read voltage, based an error detection result of the error correction block 1250, and perform re-reading. In an exemplary embodiment, the error correction block 1250 may be provided as a component of the controller 1200. The error correction block 1250 may correspond to the error correction block 230, 231, 232 or 233 shown in FIG. 1, 11A, 20A or 28A.

The controller 1200 and the semiconductor memory device 1100 may be integrated into one semiconductor device. In an exemplary embodiment, the controller 1200 and the semiconductor memory device 1100 may be integrated into one semiconductor device to constitute a memory card. Examples of the memory card include a PC card (Personal Computer Memory Card International Association (PCMCIA)), a Compact Flash (CF) card, a Smart Media Card (SM or SMC), a memory stick, a Multi-Media Card (MMC, RS-MMC or MMCmicro), an SD Card (SD, miniSD, microSD or SDHC), or a Universal Flash Storage (UFS).

The controller 1200 and the semiconductor memory device 1100 may be integrated into one semiconductor device to constitute a semiconductor drive (solid state drive (SSD)). The semiconductor drive SSD includes a storage device configured to store data in a semiconductor memory. When the memory system 1005 is used as the semiconductor drive SSD, the operating speed of the host Host connected to the memory system 1005 can be remarkably improved.

In one example, the memory system 1005 may be provided as one of various components of an electronic device. Examples include a computer, an Ultra Mobile PC (UMPC), a workstation, a net-book, a Personal Digital Assistant (PDA), a portable computer, a web tablet, a wireless phone, a mobile phone, a smart phone, an e-book, a Portable Multimedia Player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

In an exemplary embodiment, the semiconductor memory device 1100 and the memory system 1005 may be packaged in various forms. Examples of the package include Package On Package (PoP), Ball Grid Arrays (BGAs), Chip Scale Packages (CSPs), Plastic Leaded Chip Carrier (PLCC), Plastic Dual In-line Package (PDIP), die in Waffle pack, die in wafer form, Chip On Board (COB), CERamic Dual In-line Package (CERDIP), plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi-Chip Package (MCP), Wafer-level Fabricated Package (WFP), or Wafer-level processed Stack Package (WSP).

Figure 36:
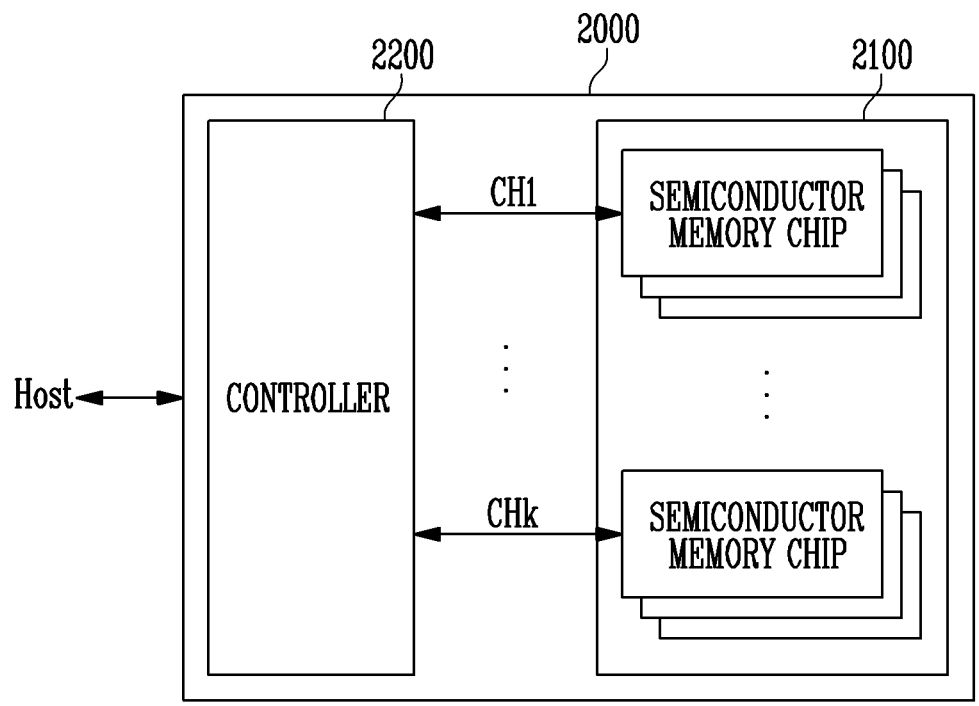
FIG. 36 illustrates an application embodiment of a memory system.

FIG. 36 is a block diagram illustrating an application example of the memory system 2000 shown in FIG. 35. Referring to FIG. 36, the memory system 2000 includes a semiconductor memory device 2100 and a controller 2200. The semiconductor memory device 2100 includes a plurality of semiconductor memory chips divided into a plurality of groups.

In FIG. 36, the plurality of groups communicate with the controller 2200 through first to kth channels CH1 to CHk. Each semiconductor memory chip may be configured and operated identically to the semiconductor memory device 100 described with reference to FIG. 2. Each group may communicate with controller 2200 through one common channel. The controller 2200 may be the same as controller 1200 described with reference to FIG. 35 and may control the memory chips of the semiconductor memory device 2100 through channels CH1 to CHk.

Figure 37:
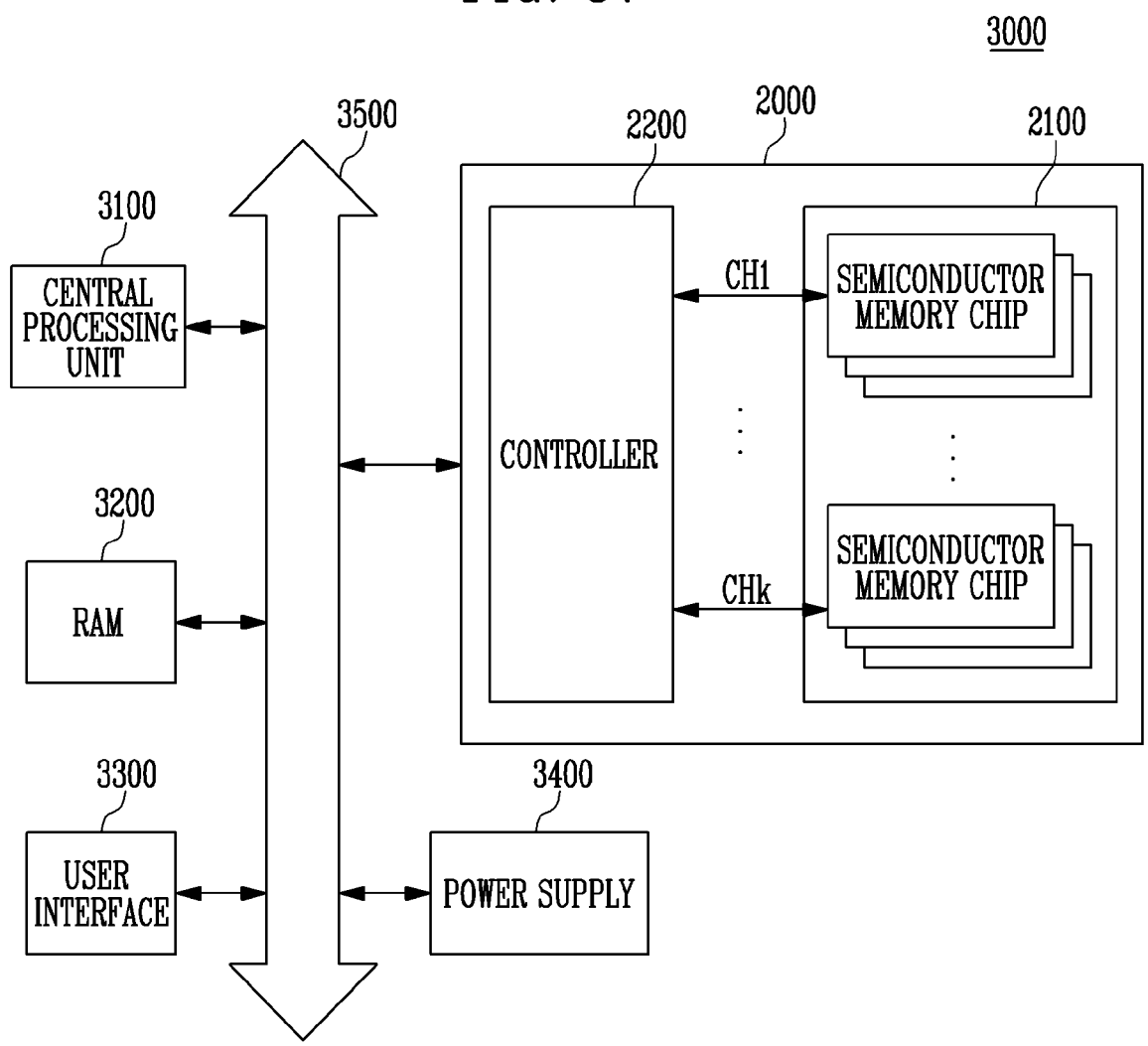
FIG. 37 illustrates an embodiment of a computing system.

FIG. 37 is a block diagram illustrating an embodiment of a computing system 3000 including the memory system described with reference to FIG. 36.

Referring to FIG. 37, the computing system 3000 includes a central processing unit 3100, a RAM 3200, a user interface 3300, a power supply 3400, a system bus 3500, and a memory system 2000. The memory system 2000 is electrically connected to the central processing unit 3100, the RAM 3200, the user interface 3300, and the power supply 3400 through the system bus 3500. Data supplied through user interface 3300 or data processed by the central processing unit 3100 are stored in the memory system 2000.

The semiconductor memory device 2100 is connected to the system bus 3500 through the controller 2200. However, the semiconductor memory device 2100 may be directly connected to the system bus 3500. The function of the controller 2200 may be performed by the central processing unit 3100 and the RAM 3200.

In FIG. 37, the memory system 2000 described with reference to FIG. 36 is provided. However, the memory system 2000 may be replaced by the memory system 1005 described with reference to FIG. 35. In an exemplary embodiment, the computing system 3000 may be configured to include both the memory systems 1005 and 2000 described with reference to FIGS. 35 and 36.

In accordance with one or more of the aforementioned embodiments, read performance of the semiconductor memory device, the controller, and the memory system having the same can be improved.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods herein.

When implemented in at least partially in software, the controllers, processors, devices, modules, units, multiplexers, blocks, generators, logic, interfaces, decoders, drivers, generators and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

While the present disclosure has been shown and described with reference to certain exemplary embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described exemplary embodiments but should be determined by not only the appended claims but also the equivalents thereof.

In the above-described embodiments, operations may be selectively performed or part thereof may be omitted. In each embodiment, the operations are not necessarily performed in accordance with the described order and may be rearranged. The embodiments disclosed in this specification and drawings are only examples to facilitate understanding, and the present disclosure is not limited thereto. That is, it should be apparent to those skilled in the art that various modifications can be made on the basis of the technological scope of the present disclosure.

Meanwhile, the exemplary embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein. The embodiments may be combined to form additional embodiments.

What is claimed is:

1. A method for operating a controller to control a semiconductor memory device including a plurality of memory blocks, the method comprising:
receiving, from the semiconductor memory device, read data output according to a first read operation performed on a selected memory block among the plurality of memory blocks;
selecting a read voltage set group among a plurality of read voltage set groups in a read retry table, the read voltage set group selected based on a read error related indicator providing an indication that an error correction failure has occurred; and
selecting a read voltage set among a plurality of read voltage sets in the selected read voltage set group, the read voltage set selected based on whether the read error related indicator is greater than or equal to a predetermined reference value, wherein selecting the read voltage set includes selecting at least one of
a read voltage set having a minimum average distance with respect to a read voltage set used for the first read operation, and
a read voltage set having a minimum first read voltage distance with respect to the read voltage set used for the first read operation.

2. The method of claim 1, wherein
the read error related indicator includes a program-erase count value of a memory block selected as a target of the first read operation, and
selecting the read voltage set group includes selecting a read voltage set group corresponding to the program-erase count value among the plurality of read voltage set groups.

3. The method of claim 2, wherein selecting the read voltage set includes:
selecting the read voltage set having the minimum average distance with respect to the read voltage set used for the first read operation among the plurality of read voltage sets in the selected read voltage set group, in response to determination that the program-erase count value of the selected memory block is greater than or equal to the predetermined reference value.

4. The method of claim 3, wherein
each of the memory cells in the selected memory block stores N-bit data,
each of the plurality of read voltage sets includes first to $(2^N-1)$th read voltages, and
an average distance between an ith read voltage set among the plurality of read voltage sets and the read voltage set used for the first read operation is calculated based on the following equation:

$$ad\_i = \sum_{k=1}^{2^N-1} |Rk\_i - Rk\_pr|,$$

where ad_i is the average distance between the ith read voltage set and the read voltage set used for the first read operation, Rk_i is a kth read voltage in the ith read voltage set, Rk_pr is a kth read voltage in the read voltage set used for the first read operation, and "i" is a natural number which is greater than 0 and is less than or equal to a number of read voltage sets included in the read retry table.

5. The method of claim 4, wherein selecting the read voltage set includes selecting a read voltage set having a smallest average distance with the read voltage set used for the first read operation among the plurality of read voltage sets.

6. The method of claim 2, wherein selecting the read voltage set includes selecting the read voltage set having the minimum first read voltage distance with respect to the read voltage set used for the first read operation, in response to determination that the program-erase count value of the selected memory block is smaller than the predetermined reference value.

7. The method of claim 6, wherein
each of the memory cells in the selected memory block stores N-bit data,
each of the plurality of read voltage sets includes first to $(2^N-1)$th read voltages, and
a first read voltage distance between an ith read voltage set among the plurality of read voltage sets and the read voltage set used for the first read operation is calculated based on the following equation:

$$d\_i = |R1\_i - R1\_pr|,$$

where R1_i is a first read voltage in the ith read voltage set, R1_pr is a first read voltage in the read voltage set used for the first read operation, and "i" is a natural number which is greater than 0 and is less than or equal to a number of read voltage sets in the read retry table.

8. The method of claim 7, wherein selecting the read voltage set includes selecting a read voltage set having a smallest first read voltage distance with the read voltage set used for the first read operation among the plurality of read voltage sets.

9. The method of claim 1, wherein
the read error related indicator includes an error bit rate occurring in the error correction failure of the read data, and
selecting the read voltage set group includes selecting a read voltage set group corresponding to the error bit rate among the plurality of read voltage set groups.

10. The method of claim 9, wherein selecting the read voltage set includes selecting the read voltage set having the minimum average distance with respect to the read voltage set used for the first read operation, in response to determination that the error bit rate is greater than or equal to the predetermined reference value.

11. The method of claim 9, wherein selecting the read voltage set includes selecting the read voltage set having the minimum first read voltage distance with respect to the read voltage set used for the first read operation, in response to determination that the error bit rate is smaller than the predetermined reference value.

12. A controller for controlling a semiconductor memory device including a plurality of memory blocks, the controller comprising:
a storage configured to store a read retry table including a plurality of read voltage sets;
a read voltage controller configured to adjust a read voltage for a read operation of the semiconductor memory device; and
error correction logic configured to perform an error correction operation on read data received as a result of a first read operation performed corresponding to a read request, wherein the read voltage controller is configured to
select a read voltage set group among a plurality of read voltage set groups in the read retry table, the read voltage set group selected based on a read error related indicator providing an indication that an error correction failure of read data has occurred;
select at least one of a read voltage set having a minimum average distance with a read voltage set used for the first read operation and a read voltage set having a minimum first read voltage distance with respect to the read voltage set used for the first read operation, the read voltage set selected from among a plurality of read voltage sets in the selected read voltage set group and based on whether the read error related indicator is greater than or equal to the predetermined reference value; and
control the semiconductor memory device to perform a second read operation corresponding to the read request based on the selected read voltage set.

13. The controller of claim 12, wherein
the read error related indicator includes a program-erase count value of a memory block selected as a target of the first read operation, and
the read voltage controller is configured to select the read voltage set group among the plurality of read voltage set groups in the read retry table, the read voltage set group selected based on the program-erase count value of the selected memory block in response to the error correction failure of the read data.

14. The controller of claim 13, wherein
when the program-erase count value of the selected memory block is greater than or equal to the predetermined reference value, the read voltage controller is configured to select the read voltage set having the minimum average distance with respect to the read voltage set used for the first read operation, from among a plurality of read voltage sets in the selected read voltage set group.

15. The controller of claim 14, wherein
each of the memory cells in the selected memory block stores N-bit data,
each of the plurality of read voltage sets includes first to $(2^N-1)$th read voltages, and
an average distance between an ith read voltage set among the plurality of read voltage sets and the read voltage set used for the first read operation is calculated based on the following equation:

$$ad\_i = \Sigma_{k=1}^{2^N-1} |Rk\_i - Rk\_pr|,$$

where ad_i is the average distance between the ith read voltage set and the read voltage set used for the first read operation, Rk_i is a kth read voltage included in the ith read voltage set, Rk_pr is a kth read voltage included in the read voltage set used for the first read operation, and "i" is a natural number which is greater than 0 and is less than or equal to a number of read voltage sets in the read retry table.

16. The controller of claim 13, wherein
when the program-erase count value of the selected memory block is less than the predetermined reference value, the read voltage controller is configured to select the read voltage set having the minimum first read voltage distance with respect to the read voltage set used for the first read operation, from among a plurality of read voltage sets in the selected read voltage set group.

17. The controller of claim 16, wherein
each of the memory cells in the selected memory block stores N-bit data,
each of the plurality of read voltage sets includes first to $(2^N-1)$th read voltages, and
a first read voltage distance between an ith read voltage set among the plurality of read voltage sets and the read voltage set used for the first read operation is calculated based on the following equation:

$$d\_i = |R1\_i - R1\_pr|,$$

where R1_i is a first read voltage in the ith read voltage set, R1_pr is a first read voltage in the read voltage set used for the first read operation, and "i" is a natural number which is greater than 0 and is less than or equal to a number of read voltage sets in the read retry table.

18. The controller of claim 12, wherein
the read error related indicator includes an error bit rate occurring in the error correction failure of the read data, and
the read voltage controller is configured to select the read voltage set group from among the plurality of read voltage set groups in the read retry table, the read voltage set group selected based on the error bit rate in response to the error correction failure of the read data.

19. The controller of claim 18, wherein
when the error bit rate is greater than or equal to the predetermined reference value, the read voltage controller is configured to select the read voltage set having the minimum average distance with respect to the read voltage set used for the first read operation, from among the plurality of read voltage sets in the selected read voltage set group.

20. The controller of claim 18, wherein
when the error bit rate is less than the predetermined reference value, the read voltage controller is configured to select the read voltage set having the minimum first read voltage distance with respect to the read voltage set used for the first read operation, from among the plurality of read voltage sets in the selected read voltage set group.

* * * * *